(12) United States Patent
Yamaguchi

(10) Patent No.: US 7,768,266 B2
(45) Date of Patent: Aug. 3, 2010

(54) VEHICLE BATTERY MONITOR APPARATUS AND METHOD FOR DETECTING BATTERY CHANGE

(75) Inventor: Kazuhi Yamaguchi, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 497 days.

(21) Appl. No.: 11/711,029

(22) Filed: Feb. 27, 2007

(65) Prior Publication Data

US 2007/0216407 A1 Sep. 20, 2007

(30) Foreign Application Priority Data

Mar. 1, 2006 (JP) .............................. 2006-055077
Feb. 26, 2007 (JP) .............................. 2007-045849

(51) Int. Cl.
*G01N 27/416* (2006.01)

(52) U.S. Cl. .................... 324/430; 320/104; 320/134

(58) Field of Classification Search ................ 320/426, 320/430, 134, 165, 104
See application file for complete search history.

(56) References Cited

U.S. PATENT DOCUMENTS

| 5,281,919 | A  | * | 1/1994 | Palanisamy .................. 324/427 |
| 6,987,377 | B2 | * | 1/2006 | Sakakibara et al. ......... 320/132 |
| 2003/0030414 | A1 | | 2/2003 | Suzuki |
| 2003/0214303 | A1 | | 11/2003 | Ying |
| 2006/0197503 | A1 | | 9/2006 | Arai et al. |

FOREIGN PATENT DOCUMENTS

| EP | 1 610 139 A1 | 12/2005 |
| JP | A-5-265072 | 10/1993 |
| JP | A-2001-297800 | 10/2001 |
| JP | A-2004-311136 | 11/2004 |
| JP | A-2006-038593 | 2/2006 |
| JP | A-2006-144676 | 6/2006 |

* cited by examiner

*Primary Examiner*—Edward Tso
*Assistant Examiner*—Aaron Piggush
(74) *Attorney, Agent, or Firm*—Oliff & Berridge, PLC

(57) ABSTRACT

A battery monitor apparatus and method for an automotive battery system including a battery for supplying power to in-vehicle electrical equipment and sensors for detecting battery voltage, the charge/discharge current and the battery temperature are disclosed. The capacitance and the internal actual resistance of the battery are calculated at the time of starting the engine. Further, the theoretical internal resistance of the battery corresponding to the ambient temperature and the battery open-circuit voltage during the stationary engine state are detected in advance. Based on the change in the battery open-circuit voltage, the battery change is provisionally determined. After that, battery change or degeneration can be determined based on battery capacitance, the actual and theoretical internal resistance values of the battery, the battery open-circuit voltage and the provisional battery change determination value.

1 Claim, 23 Drawing Sheets

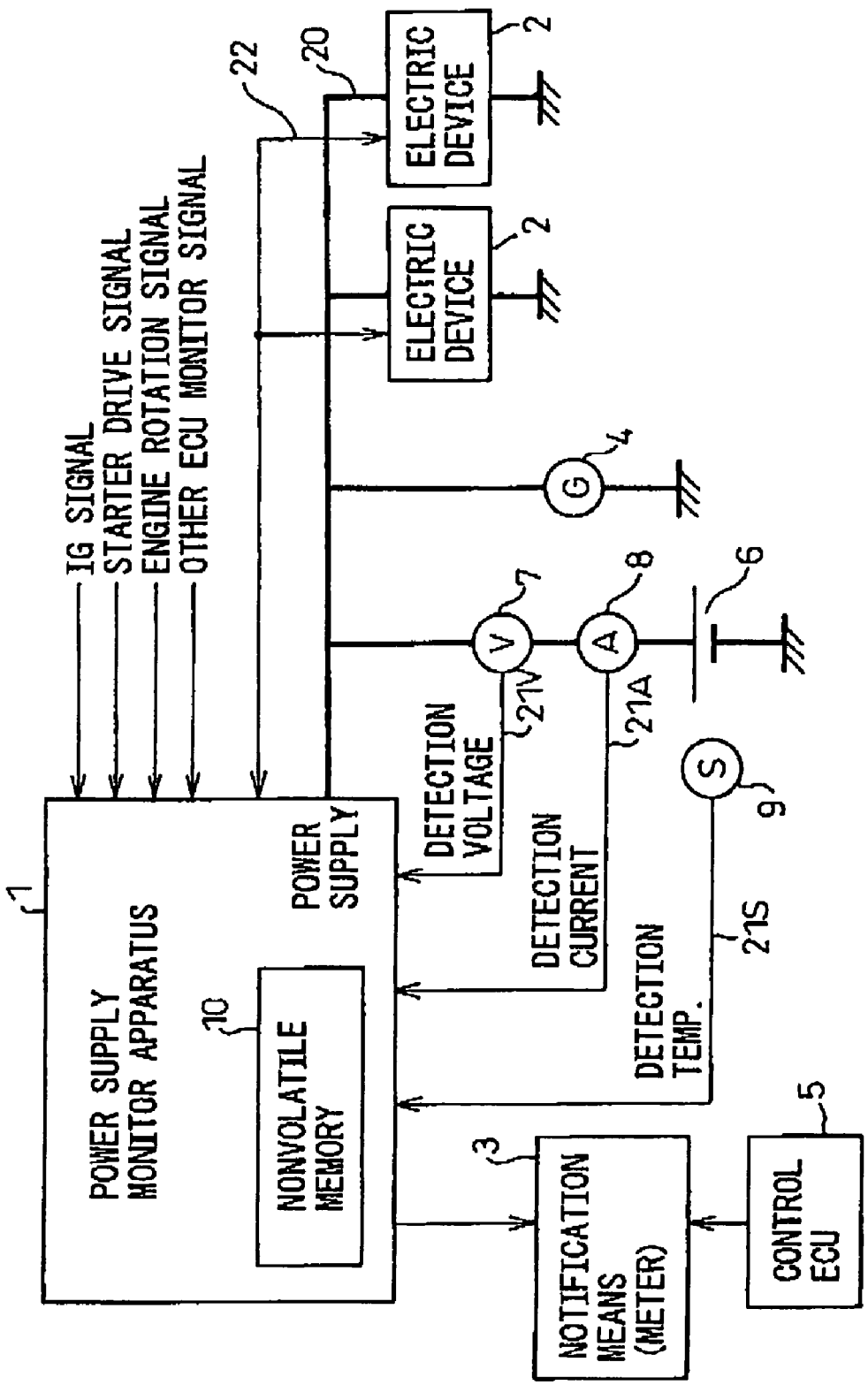

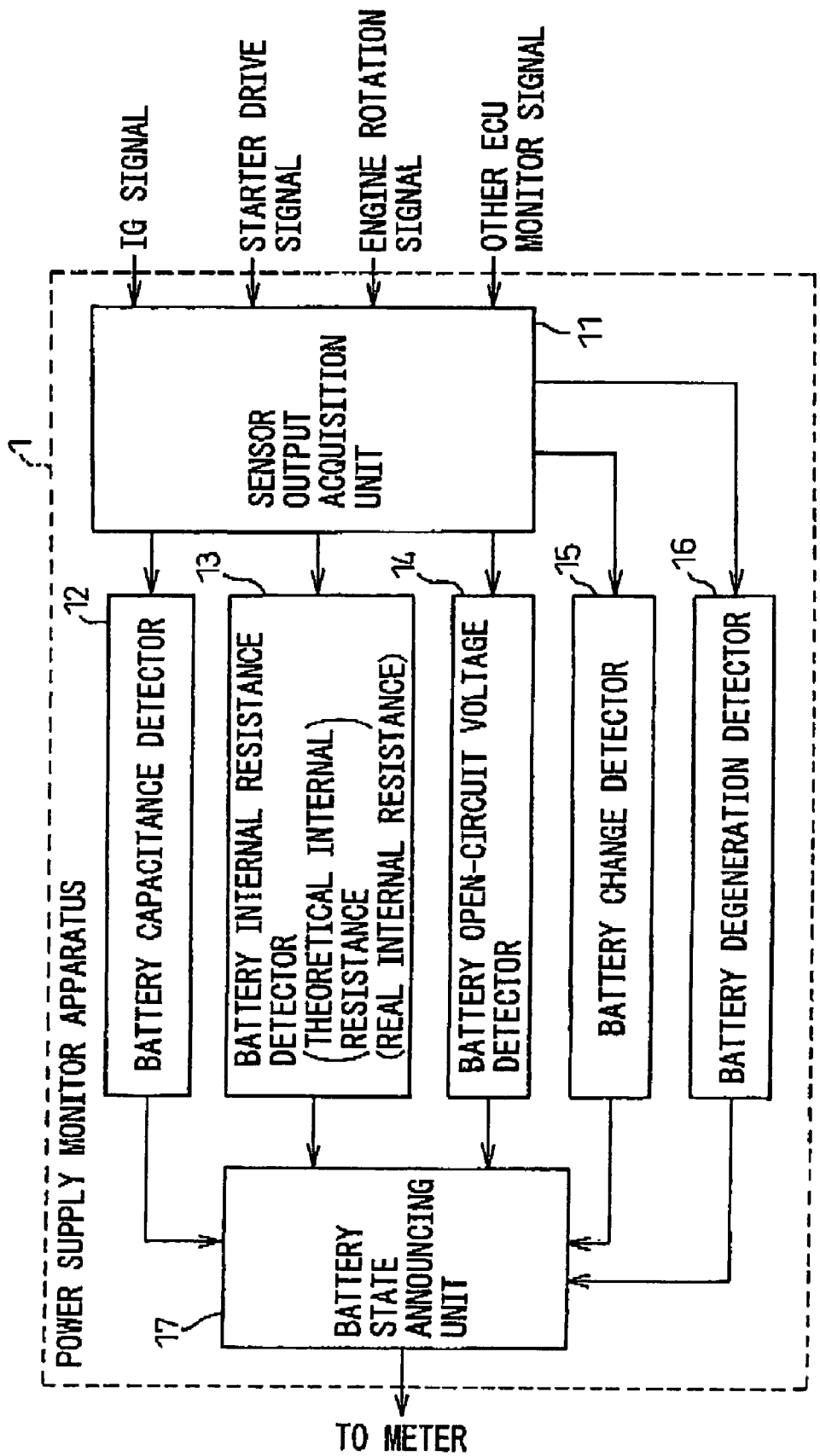

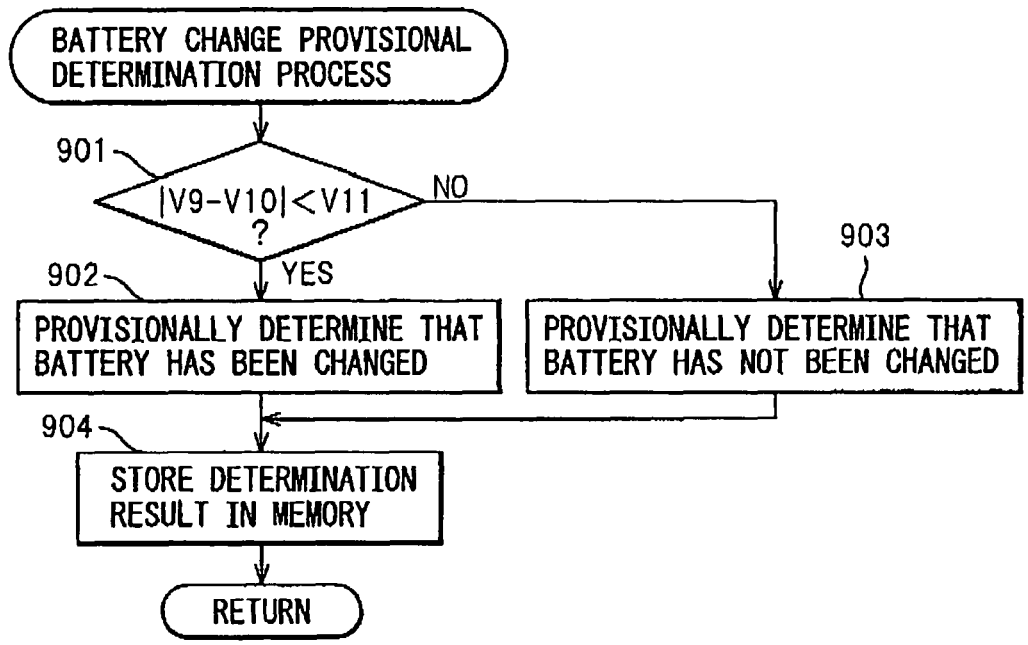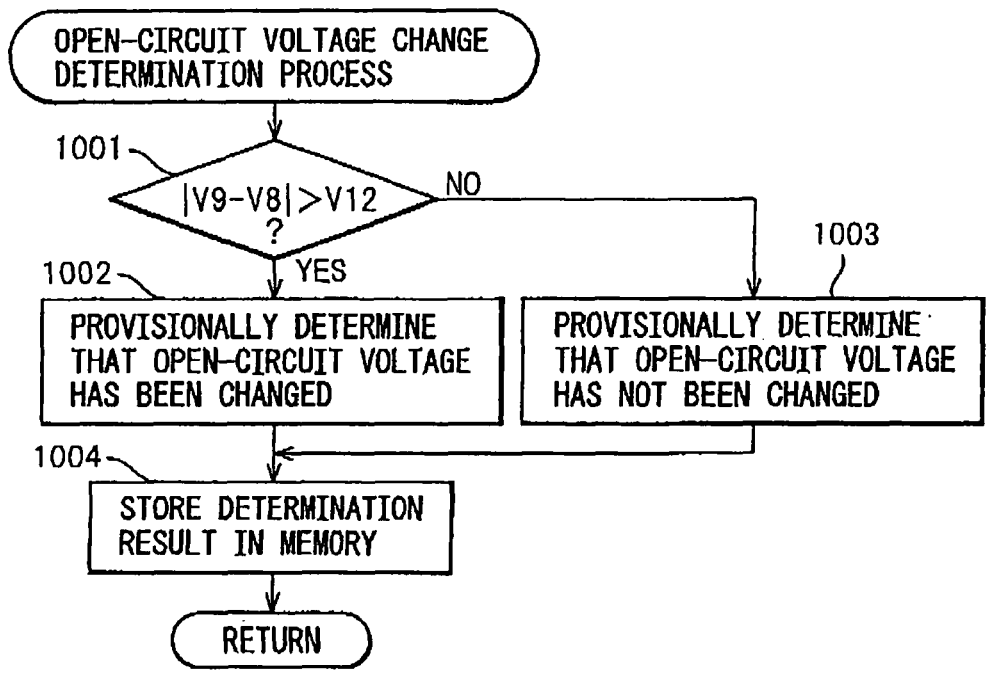

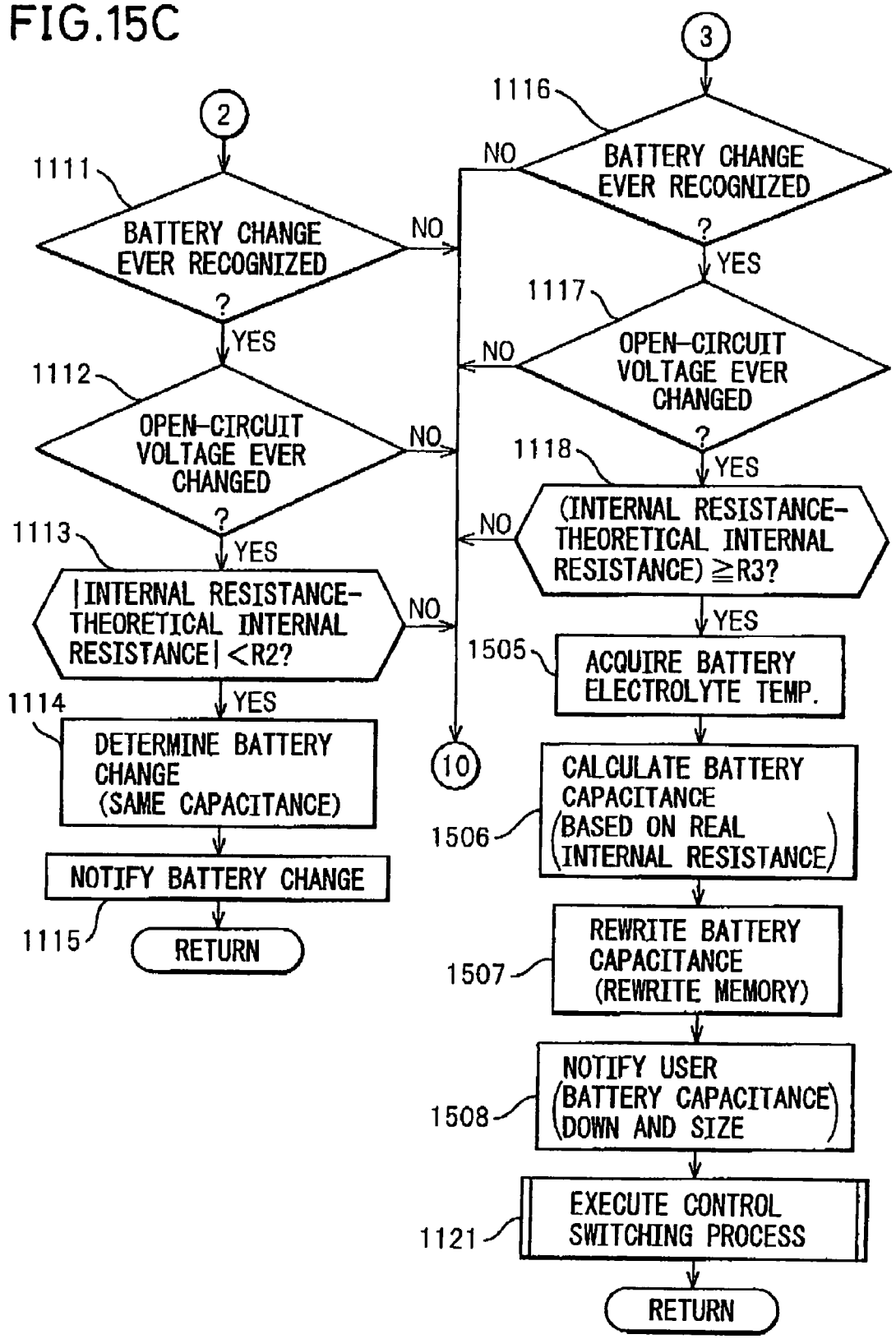

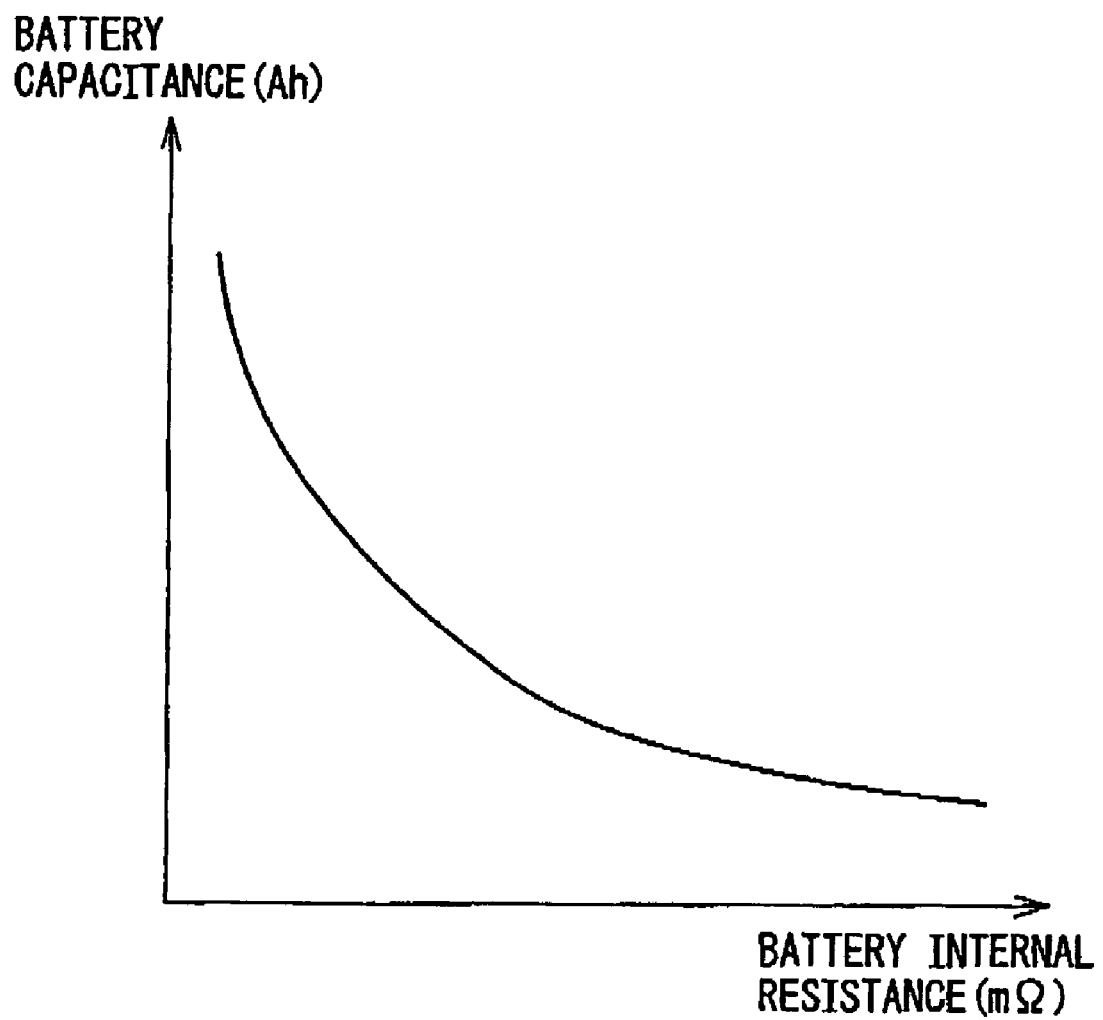

VEHICLE BATTERY MONITOR APPARATUS AND METHOD FOR DETECTING BATTERY CHANGE

CROSS-REFERENCE TO RELATED APPLICATION

This application claims priority from, and incorporates by reference the entire disclosure of, Japanese Patent Applications No. 2006-055077, filed on Mar. 1, 2006, and No. 2007-045849, filed on Feb. 26, 2007.

BACKGROUND OF THE INVENTION

1. Field of the Invention

This invention relates to an apparatus and method of monitoring the battery of an automotive vehicle, or in particular a battery monitor apparatus and method for automobiles and other vehicles capable of detecting the need of change and the degeneration of the battery with a simple configuration.

2. Description of the Related Art

Conventionally, vehicles, or typically, automotive vehicles running on the road have three basic factors of operation to be controlled, "run", "stop" and "turn". With the recent development of electronic control operation, however, comfort has become a desire of vehicle users, and the present tendency is toward an increased number of items to be controlled in the vehicle. The manual operation of the seat position and slide door open/close operation, for example, are being electrified, and an electrically-operated curtain and a multispeaker surround system have been added as new parts to be controlled.

On the other hand, most of the in-vehicle devices to be controlled in seeking comfort are electric devices using an in-vehicle battery, and therefore, the battery for supplying power to these electric devices has come to play an important role in the vehicle. A lead storage battery is mainly used as the in-vehicle battery, and supplies power to electric devices, and is charged by an alternator which generates power by the rotation of the vehicle engine.

Although the in-vehicle battery is charged and discharged repeatedly, excessive discharge may lead to battery degeneration, and therefore, in order to prevent degeneration, the battery is controlled optimally in accordance with the battery state (battery charging rate). After a vehicle is left parked, for example, the battery may be discharged (exhausted) by the standby current (dark current) of the electric devices. As a means for preventing the battery exhaustion, a control operation to reduce the discharge is carried out in accordance with the battery charging rate.

If a battery is replaced with another battery of the same size (having the same battery capacitance in a full charged state), then no problems should be encountered. However, in a case where the battery is replaced with a battery of a different size (a battery having a different battery capacity in full charged state), or in the case where the battery is degenerated, the charge control operation or the power cut operation depending on the battery capacitance is required. With regard to the detection of the need for a battery change, Japanese Unexamined Patent Publication No. 2001-297800 discloses a technique comprising a step of detecting when the battery has been changed (hereinafter referred to simply as a battery change), wherein upon detection of a battery change, a new relationship is established between the charge voltage and the current. In this specification, the appended claims and the summary, the battery capacitance is defined as that of a fully charged battery unless otherwise specified.

Also, in the case where the battery is changed, the following methods are employed to determine the battery capacitance after the change:

(1) In the case where a vehicle distributor (dealer) has changed the battery, the capacitance of the replacement battery is overwritten by the dealer in a nonvolatile memory for storing battery capacitance.

(2) Battery capacitance is measured according to battery size using an optical sensor and a battery weight sensor.

The methods of determining the battery capacitance described above, however, pose the following problems:

In method (1), no means is available for updating the value of the battery capacitance stored in the nonvolatile memory in the case where another person other than the vehicle dealer changes the battery. If the battery is changed by the user, for example, the battery monitor apparatus may erroneously indicate a battery fault (fault alarm).

In method (2), on the other hand, a plurality of sensors are required to detect battery size at an increased cost. Also, the battery state such as increased internal resistance cannot be determined from battery size or weight alone. Although the battery change can be recognized, battery degeneration cannot be detected.

SUMMARY OF THE INVENTION

Accordingly, it is an object of this invention to solve the aforementioned problem and provide a vehicle battery monitor apparatus and a method capable of detecting battery change and battery degeneration with a simple configuration.

In order to achieve the object described above, according to one aspect of the invention, there is provided a vehicle battery monitor apparatus comprising a battery capacitance calculation unit for calculating battery capacitance at the time of starting the engine, a battery internal resistance calculation unit for calculating the actual internal resistance of the battery at the time of starting the engine, a battery theoretical internal resistance calculation unit for calculating the theoretical internal resistance of the battery in accordance with ambient temperature, a battery open-circuit voltage calculation unit for detecting the open-circuit voltage of the battery when the engine is in a stationary state, a battery change provisional determining unit for provisionally determining battery change based on the change in the battery open-circuit voltage, and a battery change determining unit for determining that the battery has been changed based on the provisionally determined values of the battery capacitance, battery internal resistance, battery theoretical internal resistance, battery open-circuit voltage and battery change.

According to another aspect of the invention, there is provided a vehicle battery monitor method comprising the steps of calculating battery capacitance before starting the engine, calculating the actual internal resistance of the battery at the time of starting the engine, calculating the theoretical internal resistance of the battery corresponding to ambient temperature, detecting the open-circuit voltage of the battery when the engine is in stationary state, provisionally determining battery change based on the change in the battery open-circuit voltage, and determining battery change based on the provisionally determined values of the battery capacitance, battery internal resistance, battery theoretical internal resistance, battery open-circuit voltage and battery change.

In the vehicle battery monitor apparatus and method according to this invention, the capacitance of the battery changed can be positively detected with a simple configuration at a decreased cost.

BRIEF DESCRIPTION OF THE DRAWINGS

The present invention is illustrated by way of example, and is not limited thereby, in the figures of the accompanying drawings in which like references indicate similar elements. Note that the following figures are not necessarily drawn to scale.

FIG. 1A is a diagram showing a configuration of the battery monitor apparatus according to an embodiment of the invention.

FIG. 1B is a block diagram showing an example of the internal configuration of the power supply monitor apparatus shown in FIG. 1A.

FIG. 9 is a flowchart showing the steps of the process for provisionally determining battery change in the battery monitor apparatus according to this invention.

FIG. 10 is a flowchart showing the steps of the process for determining battery open-circuit voltage change in the battery monitor apparatus according to this invention.

FIGS. 15A to 15C are flowcharts showing the steps of a modification of the process for detecting battery change in the battery monitor apparatus according to this invention.

FIG. 16 is a map showing the relationship between battery internal resistance and battery capacitance, used in the battery change detecting process shown in FIGS. 15A to 15C.

DESCRIPTION OF THE PREFERRED EMBODIMENTS

Figure 2A:
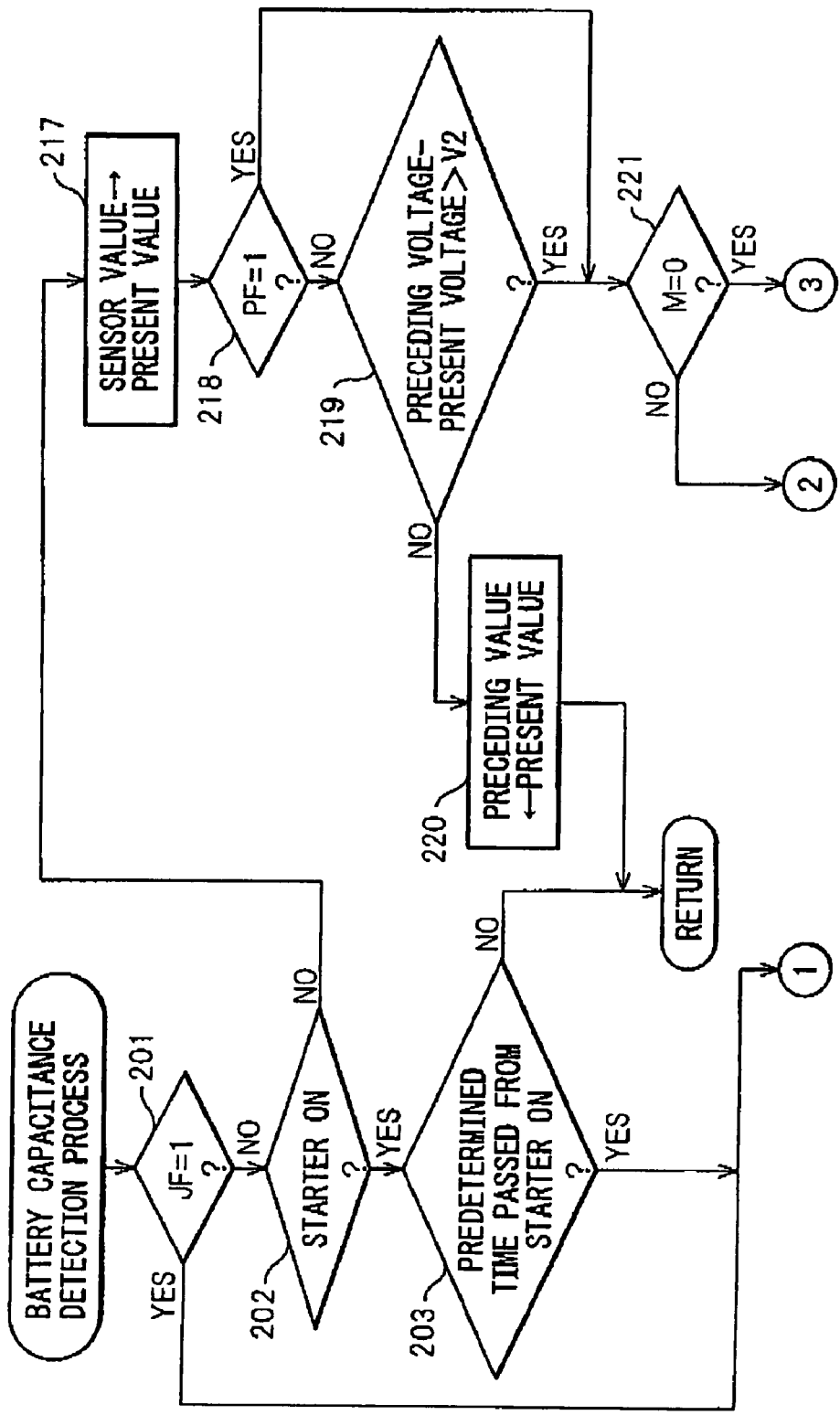
FIGS. 2A to 2C are flowcharts showing the steps of the battery capacitance detecting process constituting a part of the battery monitor method executed by the battery monitor apparatus according to the invention.

The embodiments of the invention are explained below with reference to the specific examples shown in the accompanying drawings.

FIG. 1A shows a configuration of the battery monitor apparatus 1 according to an embodiment of the invention. The battery monitor apparatus according to this embodiment is mounted in a vehicle such as an automobile supplied with an ignition (IG) signal, a starter drive signal, an engine rotation signal and other monitor signals from the ECU in operation.

Also, according to this embodiment, a nonvolatile memory 10 is arranged in the body of the power supply monitor apparatus 1. The nonvolatile memory 10 may alternatively be arranged on the outside of the power supply monitor apparatus 1. Also, the nonvolatile memory 10 may be a standby RAM. Electric devices 2 mounted on the vehicle are connected to the power supply monitor apparatus 1 through a communication line 22. Further, the power supply monitor apparatus 1 is connected with an notification means 3 configured as a gauge such as a speed meter driven by an ECU 5, so that the information described later can be transmitted to the vehicle occupants by the notification means 3.

The power supply monitor apparatus 1 and the electric devices 2, on the other hand, are supplied with power through a power supply line 20 from the battery 6. The power supply line 20 is connected with a generator (alternator) 4 for charging the battery 6. A voltage sensor 7 for detecting battery voltage and a current sensor 8 for detecting the of amount current flowing out from or into the battery 6 are arranged in the neighborhood of the positive power supply terminal of the battery 6. Also, a temperature sensor 9 such as a thermistor for detecting the liquid temperature of the battery 6 is arranged on the housing of the battery 6.

Further, the power supply monitor apparatus 1 is supplied with a voltage detection signal from the voltage sensor 7, a current detection signal from the current sensor 8 and a battery liquid temperature signal from the temperature sensor 9 through individual signal lines 21V, 21A and 21S, respectively.

FIG. 1B shows an example of the internal configuration of the power supply monitor apparatus 1 shown in FIG. 1A. The power supply monitor apparatus 1 has therein a sensor output acquisition unit 11 for acquiring an IG signal, a starter drive signal, an engine rotation signal and a monitor signal of the operating conditions of other ECUs. The sensor output acquisition unit 11 is connected to a battery capacitance detector 12, a battery internal resistance detector 13, a battery open-circuit voltage detector 14, a battery change detector 15 and a battery degeneration detector 16. The battery capacitance detector 12 detects the battery capacitance from the sensor output. The battery internal resistance detector 13 detects the theoretical internal resistance and the actual internal resistance from the sensor output. The battery open-circuit voltage detector 14 detects the battery open-circuit voltage of the engine in a stationary state. The battery change detector 15 detects whether the battery has been replaced or not. The battery degeneration detector 16 detects the degeneration of the battery.

The output of the battery capacitance detector 12, the battery internal resistance detector 13, the battery open-circuit voltage detector 14, the battery change detector 15 and the battery degeneration detector 16 are input to the battery state announcing unit 17, which in turn outputs a signal indicating the battery state and thus notifies the vehicle user of the battery conditions using a meter (gauge) mounted in the vehicle.

The operation of the sensor output acquisition unit 11, the battery capacitance detector 12, the battery internal resistance detector 13, the battery open-circuit voltage detector 14, the battery change detector 15 and the battery degeneration detector 16 will be explained with reference to the flowcharts and the control maps shown in FIGS. 2 to 14.

Figure 2B:
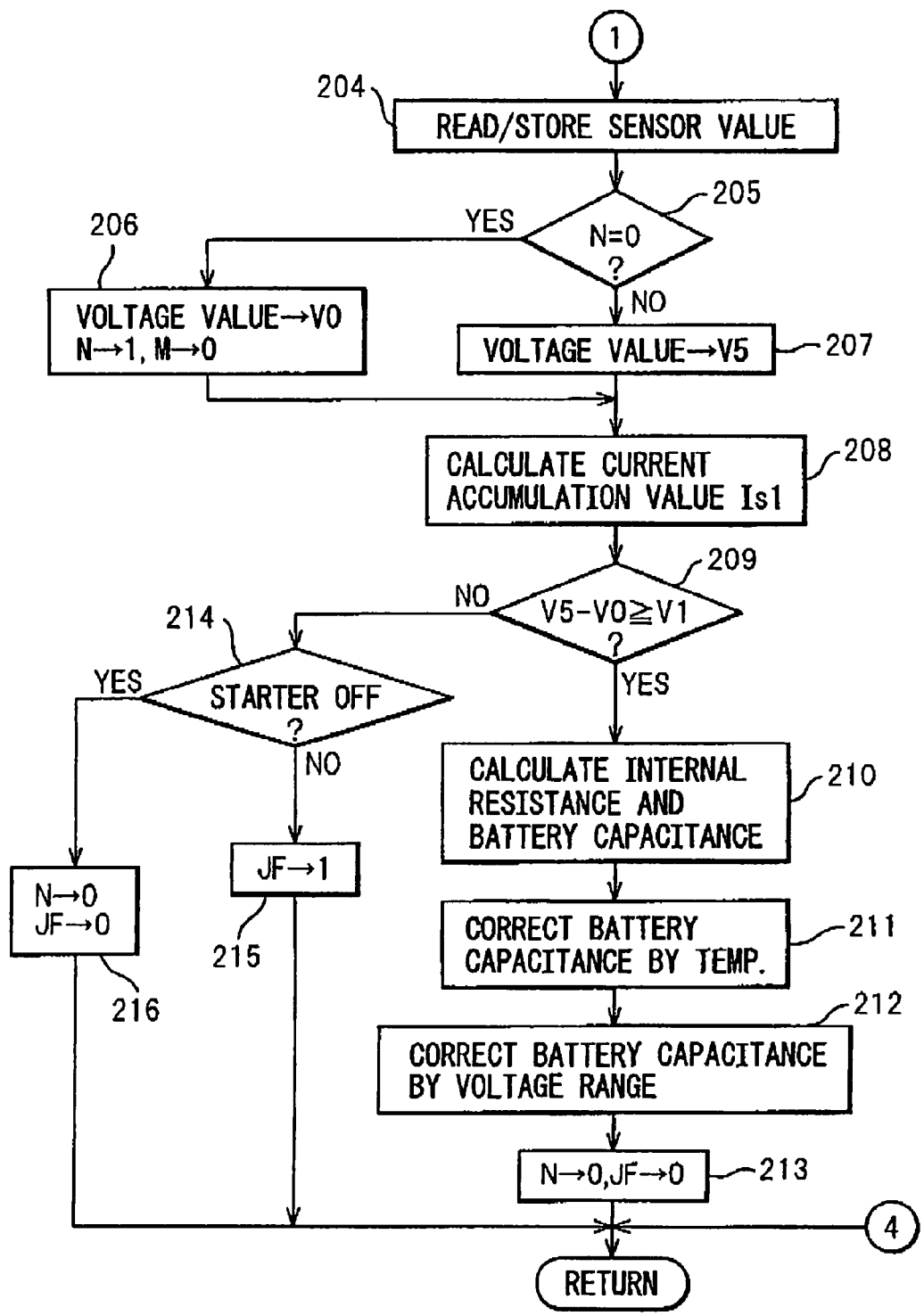
Figure 2C:
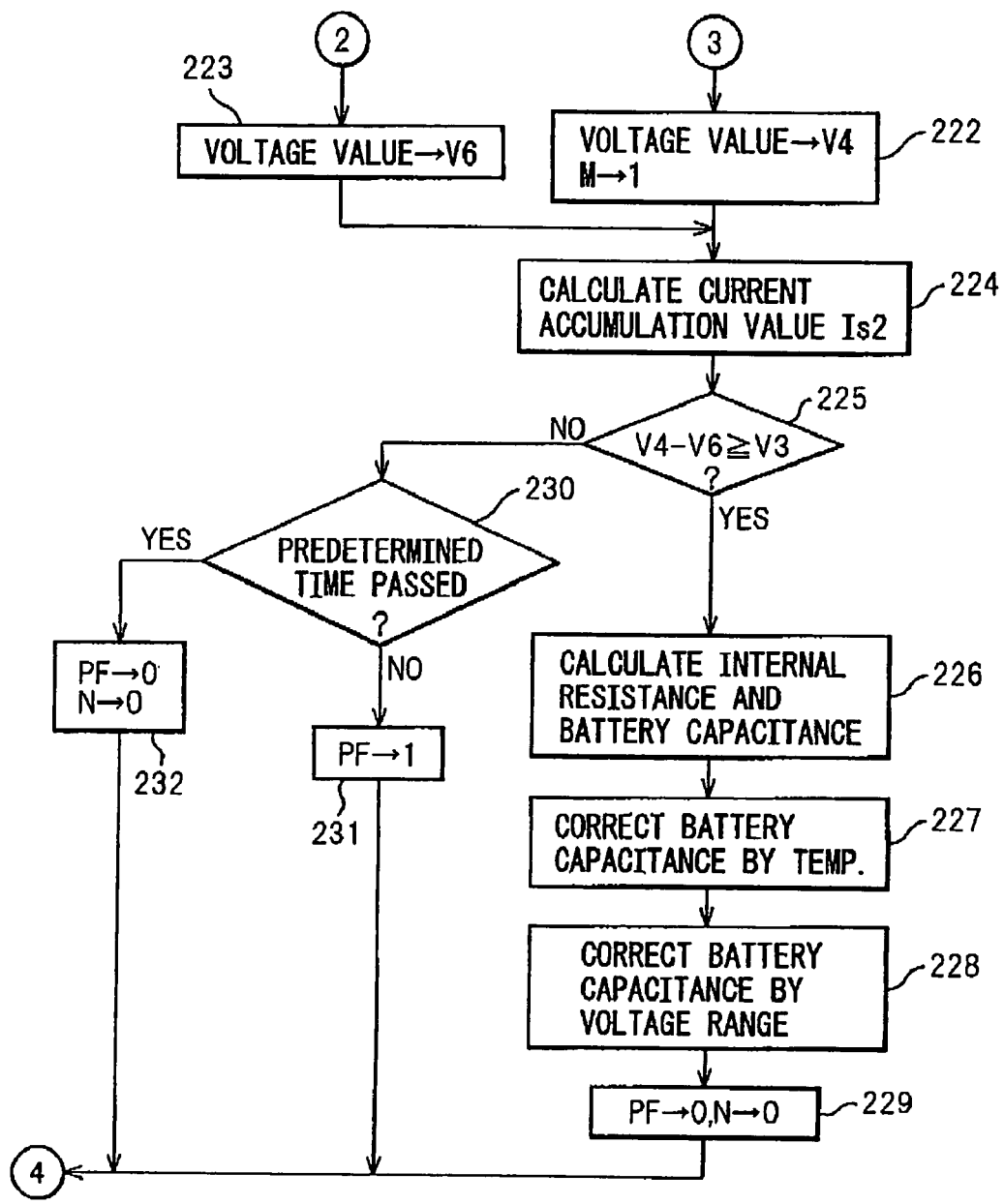

FIGS. 2A to 2C are flowcharts showing the steps of the battery capacitance detection process executed by the battery capacitance detector 12 of the battery monitor apparatus 1 shown in FIGS. 1A, 1B. This process is executed at time intervals of about 10 ms or 8 ms.

Step 201 determines whether the jump flag JF described later is in the state of 1 or not. The jump flag JF has an initial value (before the engine starter is turned on) of 0. Therefore, the determination in step 201 before the starter is on is NO, and the process proceeds to step 202. Step 202 determines whether the starter is turned on or not. First, the process executed with the starter turned on will be explained.

With the turning on of the starter, the process proceeds from step 202 to step 203. Step 203 determines whether a predetermined time has elapsed or not after the starter is turned on. In the case where the predetermined time has not elapsed from the time when the starter is turned on, this routine is finished, while in the case where the predetermined time has elapsed from the time when the starter is turned on, the process proceeds to step 204. This process is intended to prevent the detection process from being executed until the operation is settled after the starter is turned on, and the predetermined time may be set to, for example, about 20 ms.

In step 204 to which the process proceeds upon lapse of the predetermined time after the starter is turned on, the values (sensor values) detected by the voltage sensor, the current sensor and the temperature sensor are read and stored in a nonvolatile memory. The following step 205 detects, from the value of the flag N, whether the sensor values are stored for the first time upon lapse of the predetermined time. The initial value of the flag N is 0, and therefore, the process first proceeds to step 206.

In step 206, the voltage value read in step 204 is set to the initial value V0, the value of the flag N is set to 1, and the value of the flag M described later is set to 0. After the value of the flag N is set to 1, the determination in step 205 is negative and, the process proceeds from step 205 to 207, and the voltage value read in step 204 is set to V5. Upon completion of the process of step 206 or step 207, the current value read in step 204 is accumulated in step 208 thereby to calculate the current accumulation value Is1.

The following step 209 determines whether the difference between the voltage value V0 stored in step 206 and the voltage value V5 stored in step 207 is larger than a first predetermined voltage V1 or not. The voltage value V0 immediately after the starter is turned on is smaller than the subsequent voltage value V5, and therefore, the value (V5−V0) assumes a positive value. In the case where the value (V5−V0) is smaller than the first predetermined voltage V1, the process proceeds to step 214 to determine whether the starter is turned on or not.

In the case where the starter is not turned off, the process proceeds to step 215, and the jump flag is set to 1 thereby ending the routine. Once the value of the jump flag JF is set to 1, the process proceeds from step 201 to step 204 and steps 202 and 203 are skipped. In the case where the starter is turned off, the process proceeds to step 216, and the values of the flag N and the jump flag JF are both set to 0, thereby ending the routine.

In the case where the value (V5−V0) is larger than the first predetermined voltage V1 in step 209, the process proceeds to step 210. In step 210, the battery capacitance, as well as the internal resistance of the battery is calculated.

The actual internal resistance value R0 at the time of starting the engine is calculated by the following equation:

$$R0=(\text{present detection voltage}-\text{preceding detection voltage})/(\text{present detection current}-\text{preceding detection current})$$

where the present detection voltage and the present detection current are read in step 204, while the preceding detection voltage and the preceding detection current are read in the preceding process (8 ms before).

According to this embodiment, the real internal resistance value R0 is determined by one calculation session. Nevertheless, the real internal resistance value R0 may be calculated as an average value Ra of N (integer not larger than 2) calculation sessions of the real internal resistance values (R01, R01, R02, . . . ) as follows:

$$R0=Ra=(R01+R01+R02\ldots)/N$$

On the other hand, the battery capacitance calculated at the time of starting the engine according to this embodiment is the battery capacitance BC (ampere hour (AH)/1 V) per reference battery voltage V7 (V7=1, for example, for 1 (V)), and calculated by the equation:

$$BC=\{[\text{current accumulation value}/(V5-V0)]/\text{current accumulation time (ms)}\}\times V7\times 3600000$$

In the case where the reference battery voltage is set to 2 V, battery capacitance BC for 2 V can be determined.

Assuming that the current accumulation value is determined from the following equation (with the control period of, say, 8 ms):

Current accumulation value=[(current value× 3600000)/control period]+preceding current accumulation value Then, the battery capacitance BC per reference battery voltage V7 can be calculated from:

$$BC=[\text{current accumulation value}/(V5-V0)]\times V7$$

Figure 3A:
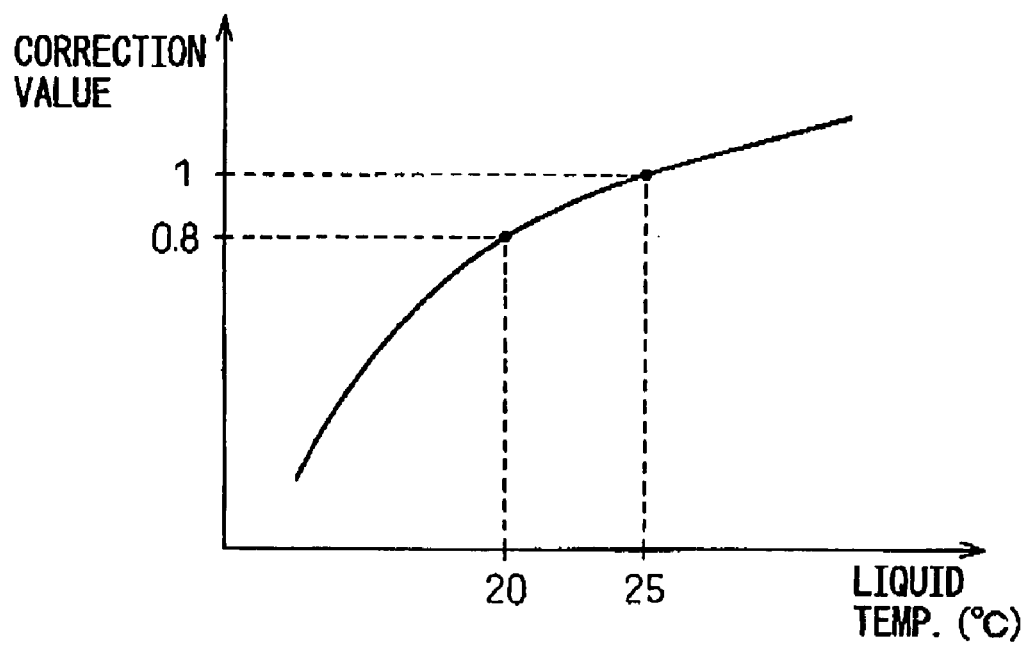
FIG. 3A is a liquid temperature vs. correction value map for correcting the value of the battery capacitance detected by the battery capacitance detecting process of FIG. 1, based on the liquid temperature of the battery.

In the next step 211, the battery capacitance calculated in step 210 is corrected by temperature. The correction of the amount of discharge electricity by battery liquid temperature at the time of turning on the starter in step 211 is carried out by the map showing the relationship between the liquid temperature and the correction coefficient in FIG. 3B. This correction is to convert the battery capacitance calculated in step 210 into the battery capacitance for the battery temperature of 25° C. As shown in FIG. 3A, assuming that the battery capacitance for the liquid temperature of 25° C. is 1, the battery capacitance for the liquid temperature of 20° C. is known to assume a value corresponding to 0.8 times the battery capacitance for the liquid temperature of 25° C. In the case where the temperature at which the battery capacitance is calculated is 20° C., the particular value is increased to 1.25 times based on the map showing the relationship between the liquid temperature and the correction coefficient in FIG. 3B.

In the next step 212, the battery capacitance is corrected in accordance with battery voltage range, and the values of both the flag N and the jump flag JF are set to 0 in step 213 thereby ending the routine. The battery capacitance is corrected in accordance with the battery voltage range using the map of FIG. 4 showing the relationship between the capacitance and the voltage value for correcting the battery capacitance by the battery voltage.

Figure 4:
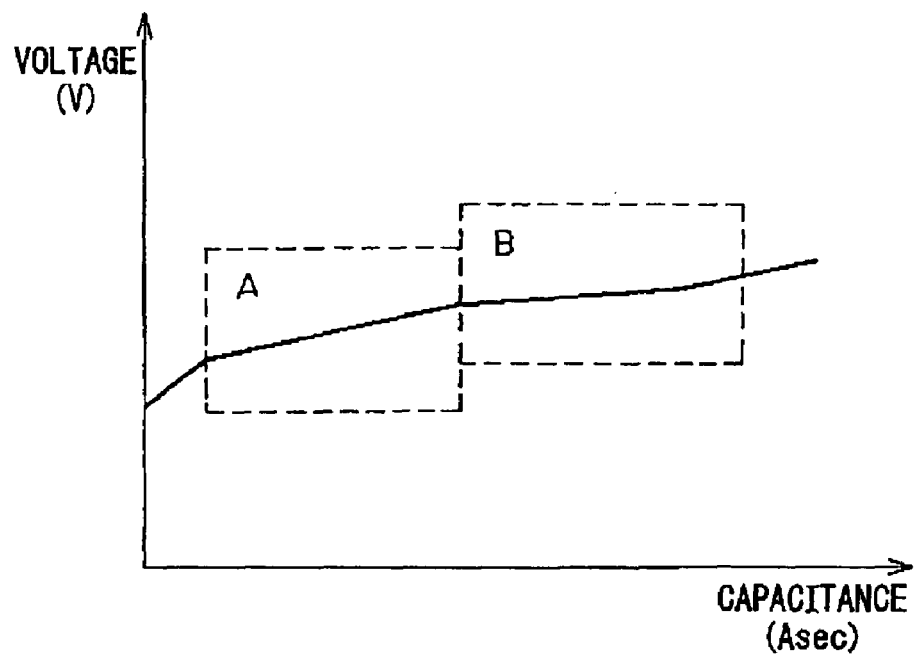
FIG. 4 is a capacitance vs. voltage value map for correcting the value of the battery capacitance detected by the battery capacitance detecting process of FIG. 2, based on the battery voltage.

The battery voltage change with respect to battery capacitance is different between the case where the battery capacitance is calculated in the area indicated by A and the case where the battery capacitance is calculated in the area indicated by B in FIG. 4. In order to calculate the battery capacitance accurately, the correction is made using the characteristic of FIG. 4 in such a manner that the battery capacitance against the battery voltage may be identical for the two areas. Usually, the battery capacitance is calculated for the assumed area A, and the correction carried out, only for area B.

In the case where step 202 determines that the starter is not on, the process proceeds to step 217. In step 217, the values (sensor values) detected by the voltage sensor, the current sensor and the temperature sensor are read, and stored in a nonvolatile memory as the present values. In the following step 218, it is determined whether the jump flag PF described later is 1 or not. The jump flag PF is 0 when the starter is turned off, and therefore, the process proceeds from step 218 to step 219 immediately after the starter is turned on. In step 219, the present voltage stored in step 217 is subtracted from the preceding voltage, and it is determined whether the difference is larger than a second predetermined voltage V2 or not. In the case where the difference between the present voltage and the preceding voltage is smaller than the second predetermined voltage, the process proceeds to step 220 where the present value read in step 217 is stored again as the preceding value, thereby ending the routine. In the case where the difference is great, the process proceeds to step 221.

Step 221 detects, in accordance with the value of the flag M, whether the sensor value is stored in step 217 for the first time after proceeding from step 202 to step 217. Since the initial value of the flag M is 0, the process first proceeds from step 219 to step 222.

In step 222, the voltage value read in step 217 is set to the initial value V4 and the value of the flag M to 1. After the value of the flag M is set to 1, the process proceeds from step 221 to 223, and the voltage value read in step 217 is set to V6. Upon completion of the process of step 222 or step 223, step 224 calculates the current accumulation value Is2 by accumulating the current value read in step 217.

The following step 225 determines whether the difference between the voltage value V4 stored in step 222 and the voltage value V6 stored in step 223 is greater than a third predetermined voltage V3 or not. As long as the starter is off, the voltage decreases, and if the voltage remains unchanged, V4 is almost equal to V6. Thus, the determination in step 225 is negative. In the case where the voltage changes considerably while the starter is off, V4 is larger than V6. Once this difference equals or exceeds the third predetermined voltage V3, the determination in step 225 is positive.

In the case where the determination in step 225 is negative, the process proceeds to step 230 thereby to determine whether a predetermined time has elapsed from the time when the process proceeds to step 217 from step 202 for the first time. In the case where the predetermined time has not elapsed, the value of the jump flag PF is set to 1 in step 231, and the routine ends. In the case where the predetermined time has elapsed, the values of the jump flag PF and the flag N are both set to 0 in step 232, thereby ending this routine. In the case where the value of the jump flag PF is set to 1 in step 231, the determination in the next step 218 is positive, and therefore, the process of step 219 is subsequently jumped and cut off.

In the case where step 225 determines that the value (V4−V6) is not less than the third predetermined voltage V3, the process proceeds to step 226. In step 226, the actual internal resistance value and battery capacitance are calculated. The methods of calculating the actual internal resistance value and battery capacitance are already explained and will not be explained hereafter.

In the next step 227, the battery capacitance calculated in step 226 is corrected by temperature, followed by step 228 in which the battery capacitance is corrected in accordance with the battery voltage range thereby ending the routine. The correction of the battery capacitance by temperature and the battery capacitance correction in accordance with the battery voltage range are already explained and therefore will not be explained hereafter.

Figure 5:
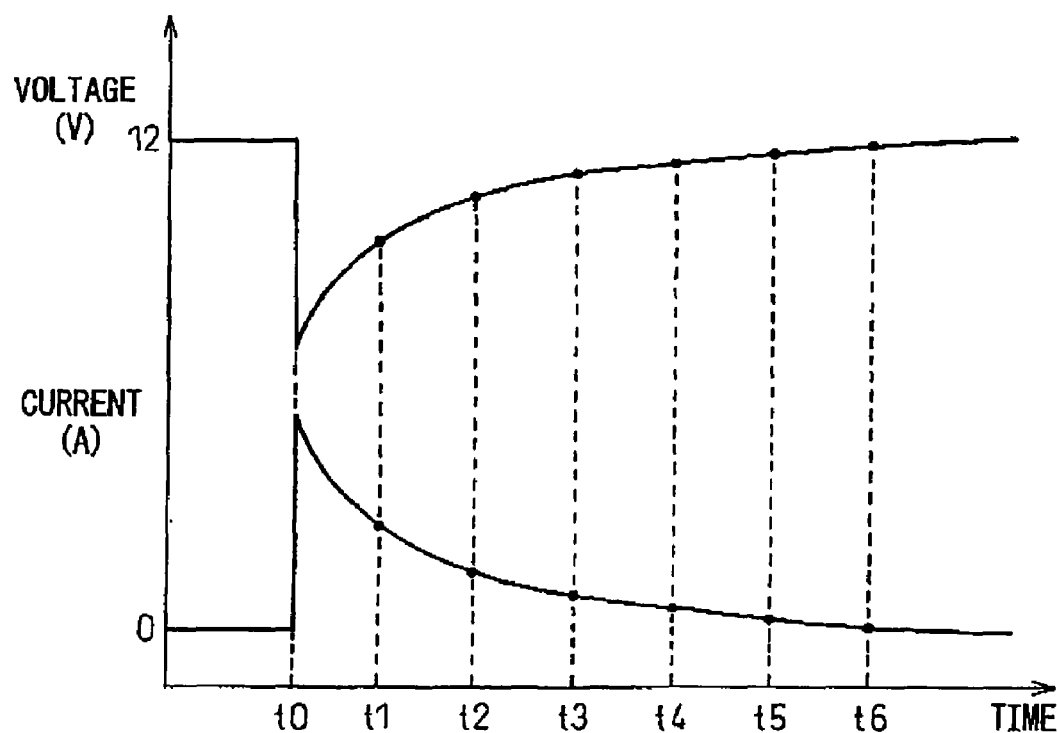
FIG. 5 is a characteristic diagram showing the temporal change in battery voltage and the battery current at the time of starting the vehicle engine with the battery monitor apparatus according to the invention mounted thereon.

FIG. 5 shows the temporal change of the battery voltage and the battery current when starting the engine of the vehicle having mounted therein the battery monitor apparatus 1 according to the invention. Assuming that the starter is turned on to start the engine at time point t0, the battery voltage sharply drops from 12 V and then gradually restores to the original voltage level. Battery current, on the other hand, surges when the starter is first turned on, and then gradually decreases. Actually, the current flows in opposite directions in the current sensor 8 when the battery 6 is charged and discharged. FIG. 5, however, fails to take the direction of current flow into consideration, and shows only the magnitude of the current flowing in the current sensor 8. According to this embodiment, the change in battery voltage and battery current after the starter is turned on at time point t0 are stored by being sampled at time points t1, t2, t3 . . . , for example, with predetermined time intervals (8 ms period)

Figure 6:
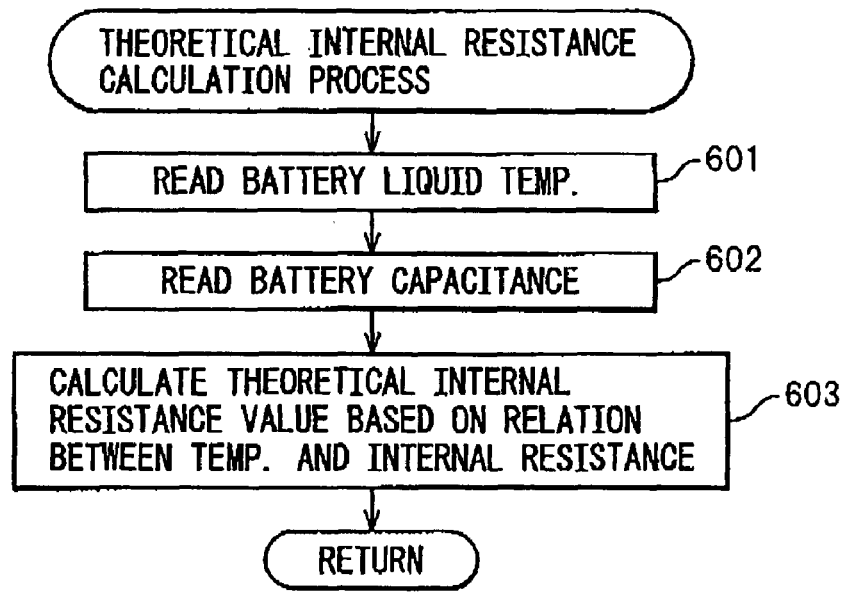
FIG. 6 is a flowchart showing the steps of the process for calculating theoretical internal resistance in the battery monitor apparatus according to this invention.
Figure 7:
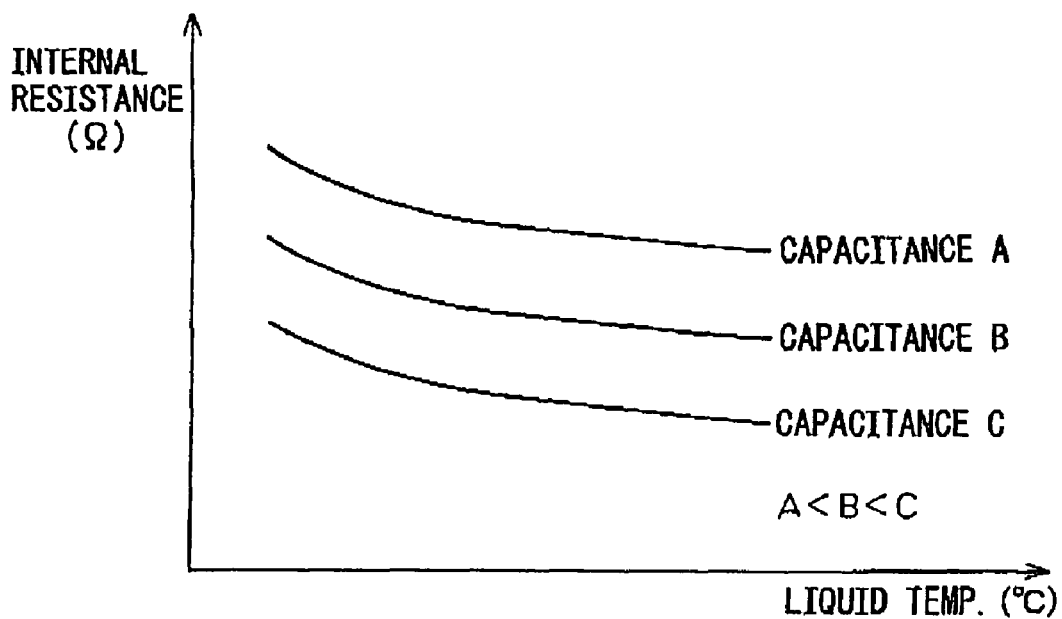
FIG. 7 is a liquid temperature vs. internal resistance characteristic map used for calculating the internal resistance from the battery liquid temperature and the battery capacitance in the process of calculating the theoretical internal resistance in FIG. 6.
Figure 8A:
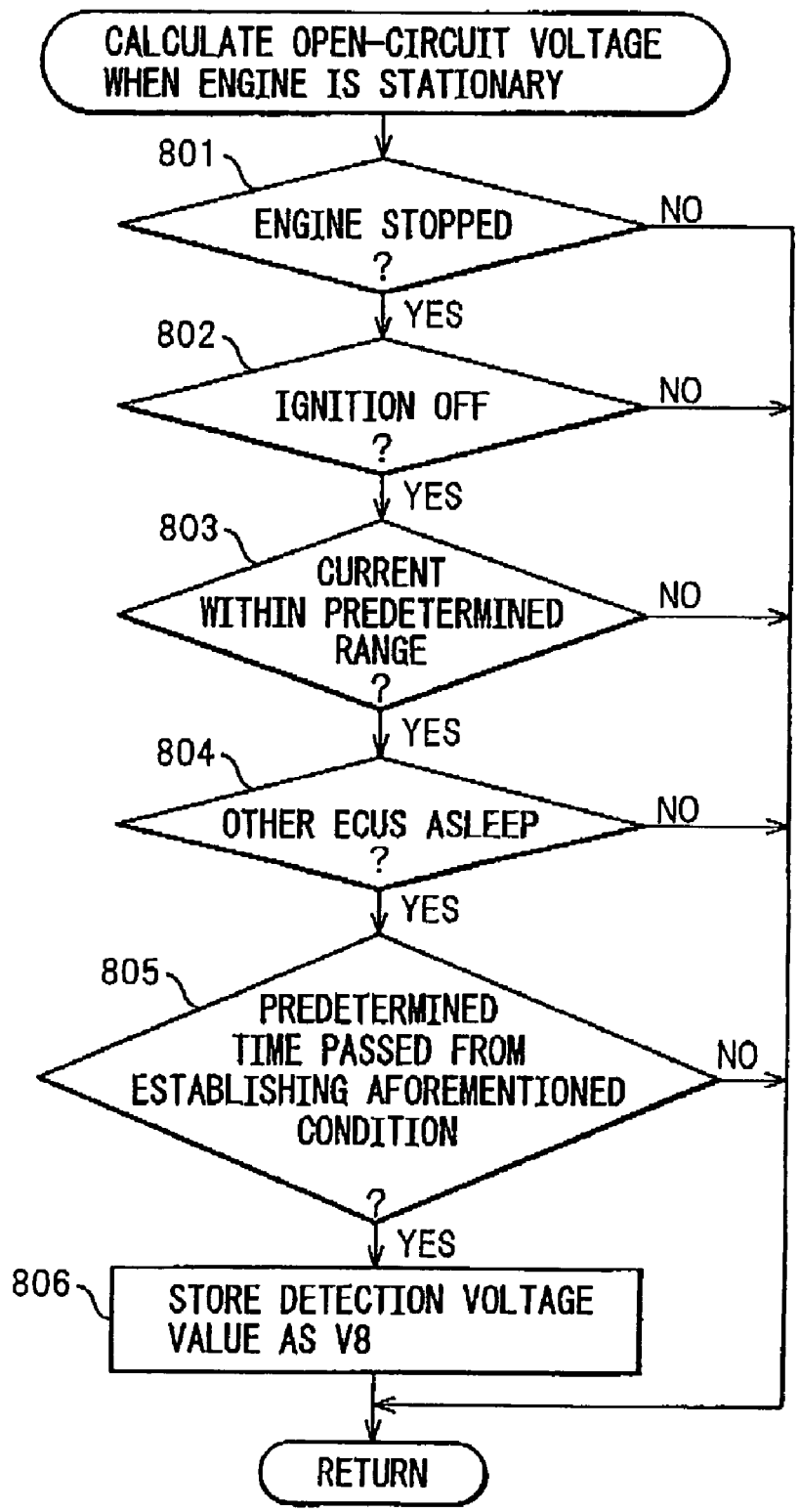
FIG. 8A is a flowchart showing the steps of calculating the battery open-circuit voltage in the battery monitor apparatus according to the invention when the engine is stationary.

FIG. 6 is a flowchart showing the steps of the process for calculating the theoretical internal resistance in the battery monitor apparatus 1 according to this invention. In step 601, battery liquid temperature is read, and in step 602, the battery capacitance stored in the nonvolatile memory is read out. In step 603, theoretical internal resistance is calculated based on the relationship between battery liquid temperature and internal resistance (stored as a map in memory) shown in FIG. 7. As understood from FIG. 7, the higher the liquid temperature and the larger the battery capacitance, the smaller the theoretical internal resistance value, FIG. 8A is a flowchart showing the steps of calculating the open-circuit voltage of the battery while the engine is stationary in the battery monitor apparatus 1 according to the invention. Step 801 determines whether the engine is running or not, and in the case where the engine is not stationary, the routine is ended. In the case where the engine is stationary, however, the process proceeds to step 802. Step 802 determines whether the ignition is turned off or not, and in the case where the ignition is not turned off, the routine is finished. In the case where the ignition is turned off, the process proceeds to step 803.

Step 803 determines whether the dark current is within a predetermined range while the engine is stationary, and as long as the dark current is not within the predetermined range, the routine is ended. In the case where the dark current is within the predetermined range, the process proceeds to step 504. Step 804 determines whether the other ECUs are in sleep mode or not, and in the case where the other ECUs are not asleep, the routine is ended, however if other ECUs are asleep, the process proceeds to step 805.

Step 805 determines whether a predetermined time has elapsed from the establishment of the condition that all of the determination results of steps 801 to 804 are positive. Before lapse of the predetermined time from the establishment of the condition, the routine is ended, while in the case where the predetermined time has elapsed from the establishment of the condition, the process proceeds to step 806, and the detection voltage value is stored as an open-circuit voltage value V8 thereby to end the routine. According to this embodiment, the open-circuit voltage value V8 is stored in one determining session. As an alternative, the average value of the voltages detected a plurality of times or the value frequently occurring among the voltage values detected a plurality of times may be stored as the open-circuit voltage value V8.

Figure 8B:
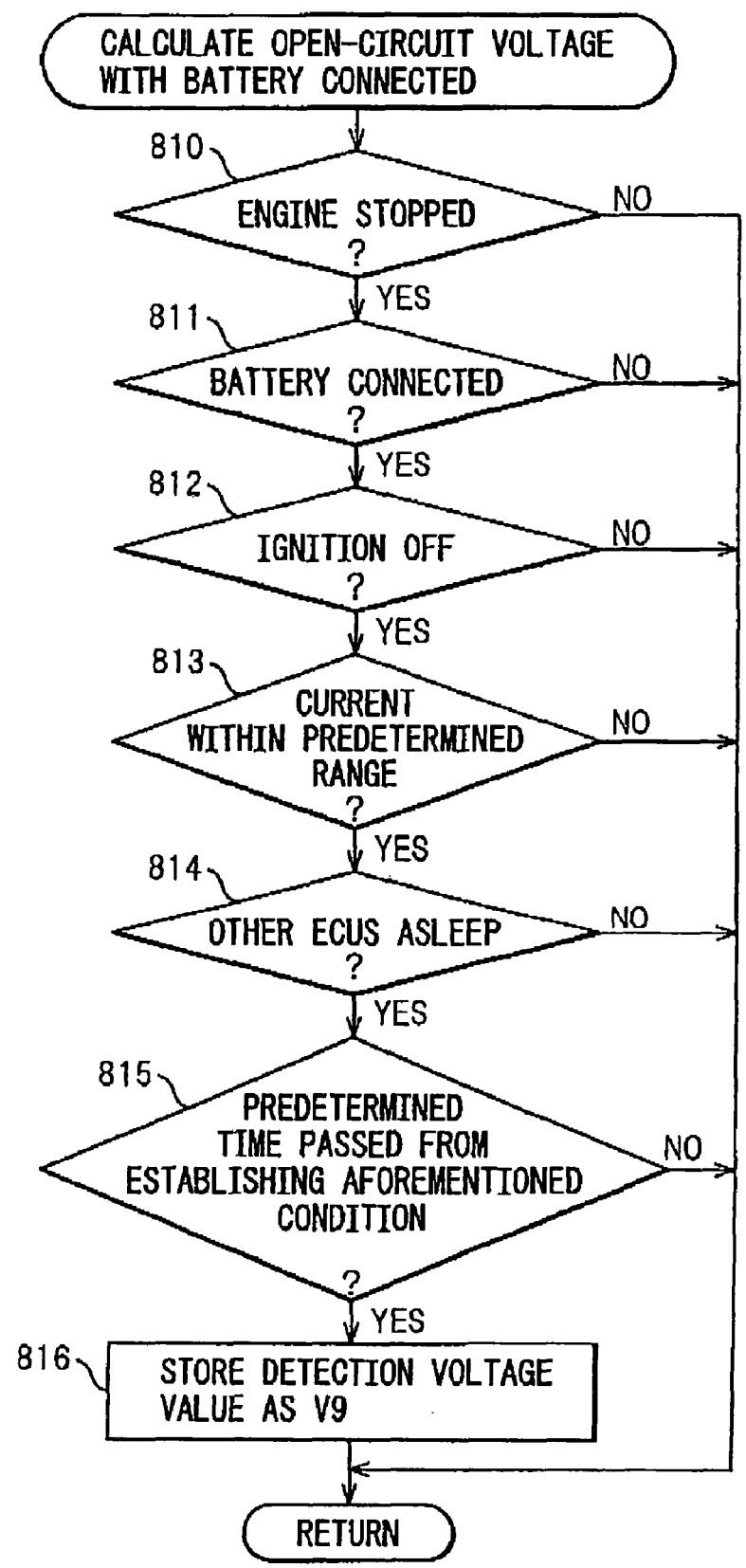
FIG. 8B is a flowchart showing the steps of calculating the open-circuit voltage of the battery when connected to the battery monitor apparatus according to the invention.

FIG. 8B is a flowchart showing the steps of calculating the battery open-circuit voltage with the battery connected in the battery monitor apparatus 1 according to this invention. Step 810 determines whether the engine is stationary or not, and while the engine is in operation, the routine is ended, however if the engine stops, the process proceeds to step 811. Step 811 determines whether the battery is connected or not, and in the case where the battery is not connected, the routine is ended, however if the battery is connected, the process proceeds to step 812. Step 812 determines whether the ignition is turned off or not, and in the case where the ignition is not off, the routine is ended, however, if the ignition is off, the process proceeds to step 813.

Step 813 determines whether the dark current is within a predetermined range while the engine is stationary, and in the case where the dark current is not within the predetermined range, the routine is ended. In the case where the dark current is within the predetermined range, the process proceeds to step 814. Step 814 determines whether the other ECUs are asleep or not, and in the case where the other ECUs are not asleep, the routine is ended, however if the other ECUs are asleep, the process proceeds to step 815.

Step 815 determines whether a predetermined time has elapsed from the establishment of the condition that all the determination results in steps 811 to 814 are positive. In the case where the predetermined time has not passed from the establishment of the condition, the routine is ended, while in the case where the predetermined time has passed, the process proceeds to step 816, in which the detection voltage value is stored as an open-circuit voltage value V9 immediately after battery change thereby ending the routine. According to this embodiment, the open-circuit voltage value V9 is stored at the first determination session. Nevertheless, the average value of the voltages detected a plurality of times or the value frequently occurring among the voltage values detected a plurality of times may be stored as the open-circuit voltage value V9.

FIG. 9 shows the steps of the process for provisionally determining the battery change executed by the battery monitor apparatus 1 according to the invention. Assuming that the battery monitor apparatus 1 has stored therein the open-circuit voltage value V10 of a brand new battery 6. This provisional determination is based on the fact that in the case where the battery is changed, the open-circuit voltage value V9 is near to the open-circuit voltage value V10 of a brand new battery 6, and therefore, the difference between V9 and V10 is small, while in the case where the battery is removed for maintenance and subsequently mounted again, the open-circuit voltage value V9 is less than the open-circuit voltage value V10 of a brand new battery 6.

Specifically, the difference between the open-circuit voltage values V9 and V10 is large when the battery is removed for maintenance and mounted again, while the difference is small when the battery is replaced with a brand new one. In step 901, the absolute value of the difference between the open-circuit voltage value V9 after battery change stored in step 816 and the open-circuit voltage value V10 of a brand new battery is calculated, and it is determined whether this value is smaller than a threshold voltage V11. The threshold voltage value V11 is about 0.1 V.

In the case where the determination in step 901 is YES, i.e. the difference of the open-circuit voltage value before and after battery change is small, the process proceeds to step 902 where the battery change is provisionally determined, after which the process proceeds to step 904 where the result of determination is stored in memory and the routine is ended. In the case where the determination in step 901 is NO, i.e. in the case where the difference of the open-circuit voltage value before and after battery change is large, the process proceeds to step 903 where the absence of battery change is provisionally determined, after which the process proceeds to step 904. Then, the result of determination is stored in memory and the routine is ended.

FIG. 10 shows the steps of the battery open-circuit voltage change determination process executed by the battery monitor apparatus 1 according to this invention. Assuming that the battery monitor apparatus 1 has stored therein the open-circuit voltage value V9 immediately after the battery 6 is replaced and the open-circuit voltage value V8 measured subsequently while the engine is stationary. In step 1001, the absolute value of the voltage difference between the open-circuit voltage value V8 and the open-circuit voltage value V9 immediately after battery change stored in steps 806 and 816, respectively, are calculated, and it is determined whether this value is greater than the threshold voltage value V12. The threshold voltage value V12 is about 0.05 V.

In the case where the determination in step 1001 is positive, i.e. when the difference between the open-circuit voltage value V9 immediately after battery change and the subsequent open-circuit voltage value V8 is large, the process proceeds to step 1002, where the change in the open-circuit voltage is provisionally determined, and the process proceeds to step 1004. This determination result is stored in memory and the routine is ended. In the case where the determination in step 1001 is negative, i.e. when the difference between the open-circuit voltage value V9 immediately after battery change and the subsequent open-circuit voltage value V8 is small, the process proceeds to step 1003, where the absence of an open-circuit voltage change is provisionally determined, followed by proceeding to step 1004, in which the determination result is stored in memory thereby ending the routine.

Figure 11A:
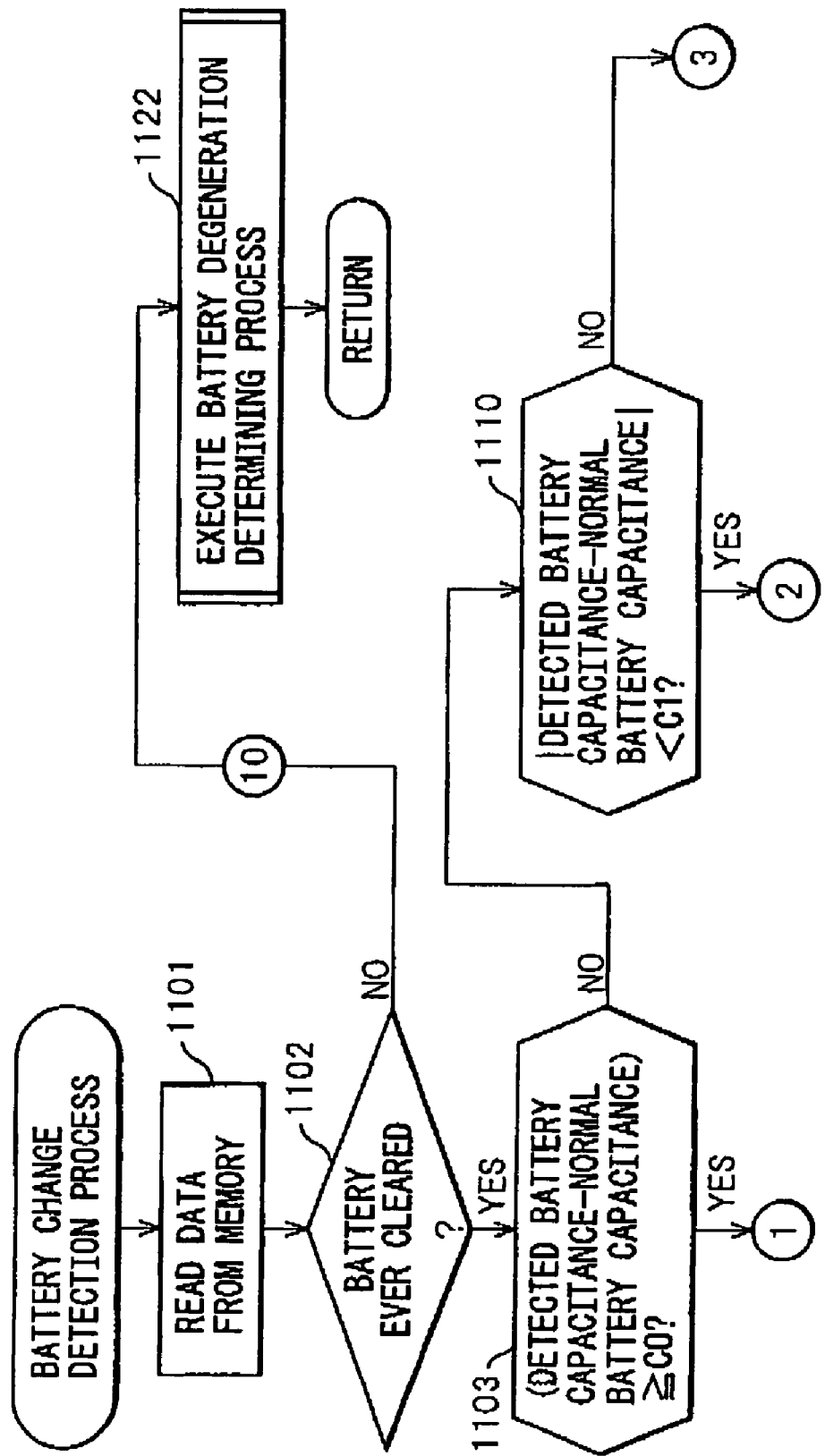
FIGS. 11A to 11C are flowcharts showing the steps of the process for detecting battery change in the battery monitor apparatus according to this invention.
Figure 11B:
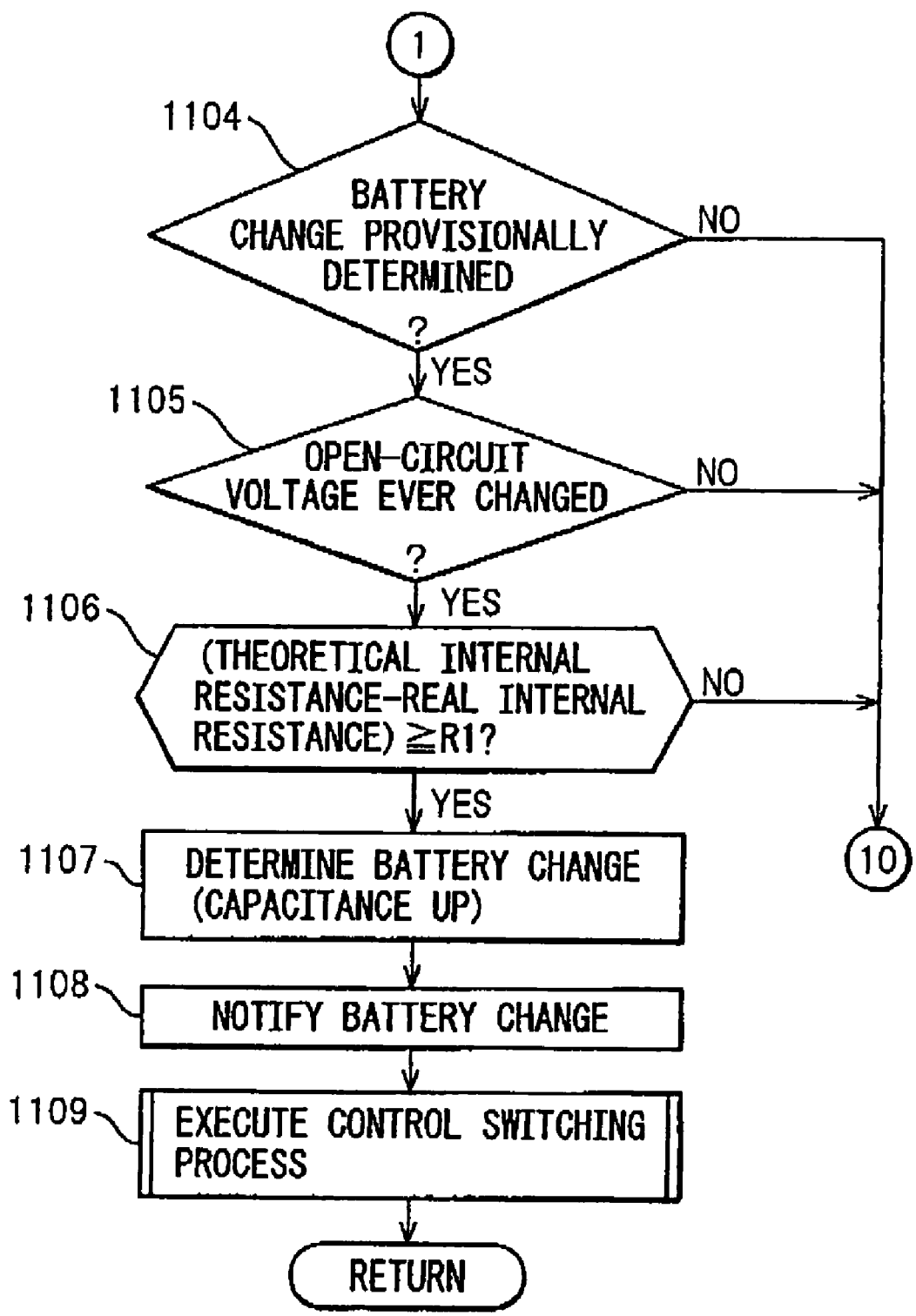
Figure 11C:
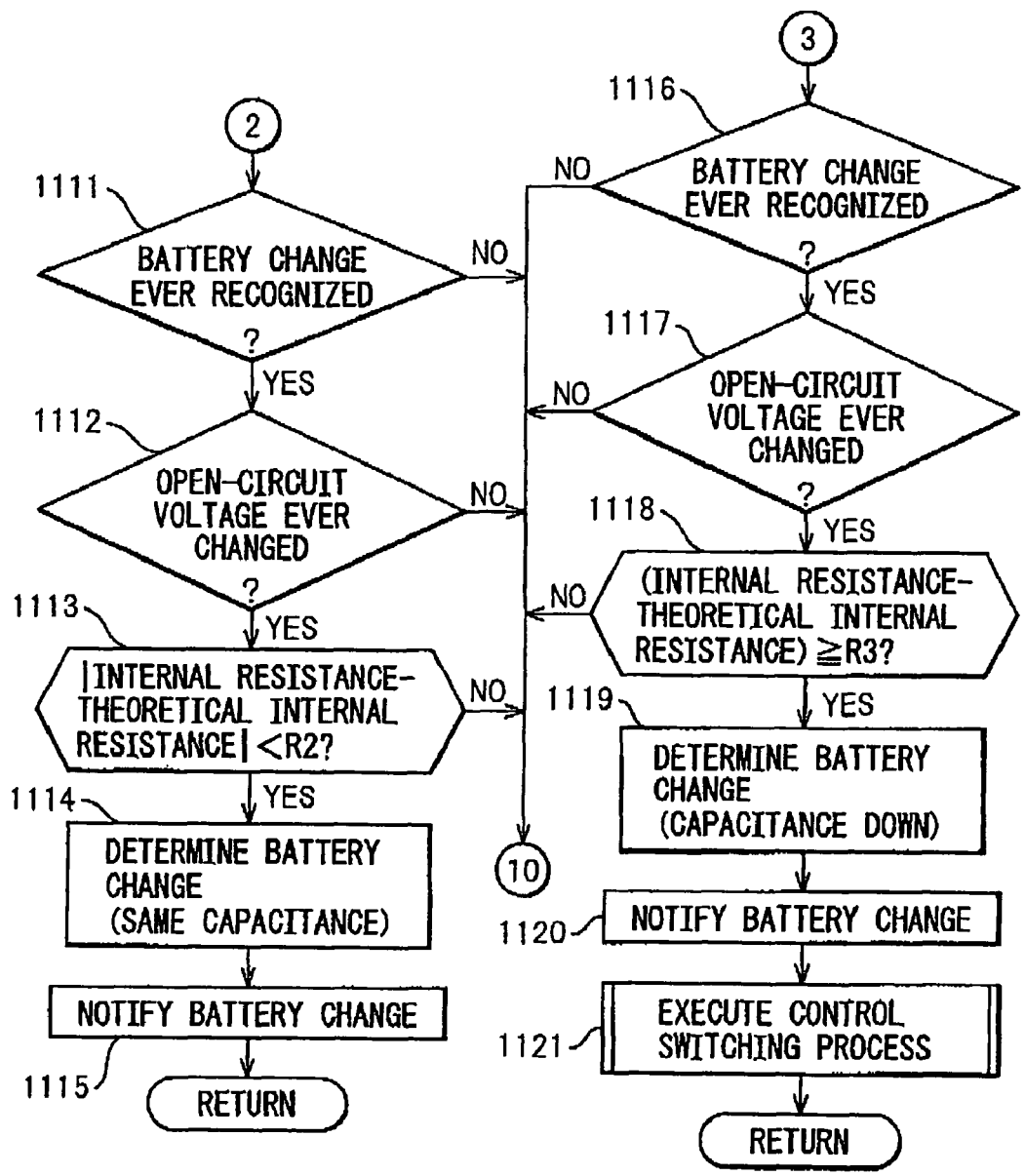

FIGS. 11A to 11C show the steps of the process for detecting the battery change executed by the battery monitor apparatus 1 according to this invention. In the case where the battery is changed, this detection process determines whether the capacitance is increased, remains unchanged or decreased by battery change. This detection process is executed after the detection of the battery capacitance and the calculation of the internal resistance after the engine starts.

In step 1101, the data required to determine the battery change is read from the nonvolatile memory 10. In the next step 1102, it is determined whether the battery has ever been cleared. The history of battery indicates the history of battery change, and in the case where the data value (RAM value) in a memory indicating the existence of the battery is destroyed, the battery change can be determined. The nonvolatile memory (RAM) includes standby RAM and normal RAM.

The standby RAM has written therein data indicating the existence of the battery, and upon battery change, this data is rewritten to another value. Thus, battery change history can be known from this data.

Upon determination in step 1102 that the battery has never been cleared, the battery is not changed and therefore the process proceeds to step 1122. In step 1122, the process of determining the battery degeneration described later is executed and the routine is ended.

Upon determination in step 1102 that the battery has never been cleared, the process proceeds to step 1103 to determine whether the difference between the detected battery capacitance and the normal battery capacitance is not smaller than the first capacitance criterion value C0 or not. An explanation is given regarding each of the cases (1) in which capacitance is increased by battery change, (2) in which the capacitance remains unchanged by battery change, and (3) in which capacitance is decreased by battery change.

(1) Process Executed in the Case Where the Capacitance is Increased by Battery Change In this case, step 1103 determines that the difference between the detected battery capacitance and the normal battery capacitance is not less than the capacitance criterion value C0, and the process proceeds to step 1104. Step 1104 determines whether the battery change is provisionally determined or not, and due to the provisional determination of battery change, the process proceeds to step 1105. Step 1105 determines whether the open-circuit voltage has ever been changed or not, and due to the open-circuit voltage change, the process proceeds to step 1106. Step 1106 determines whether or not the theoretical internal resistance value minus the actual internal resistance value is greater than the first resistance value R1. In the case where the battery change increases the capacitance, the answer is positive, and the process proceeds to step 1107 to determine the battery change (capacitance increased). In the next step 1108, the vehicle occupants are informed of the battery change by the announcing means 3 shown in FIG. 1, followed by proceeding to step 1109. In step 1109, the control switching process described later is executed thereby to end the routine. In the case where the determination Is negative in any one of steps 1104, 1105 and 1106, the battery change is not determined, but the process proceeds to step 1122 to execute the process of determining battery degeneration.

(2) Process Executed in the Case Where the Capacitance Remains Unchanged by Battery Change In this case, step 1103 determines that the difference between the detected battery capacitance and normal battery capacitance is less than the first capacitance criterion value C0 (NO), and the process proceeds to step 1110. Step 1110 determines whether the absolute value of the difference between the detected battery capacitance and the normal battery capacitance is less than a second capacitance criterion value C1 which is a small value. In the case where the capacitance remains unchanged by battery change, the difference between the detected battery capacitance and normal battery capacitance is very small, and therefore, the determination is positive, followed by proceeding to step 1111.

Step 1111 determines whether the battery change has ever been recognized or not, and due to recognition of the battery change, the process proceeds to step 1112. Step 1112 determines whether the open-circuit voltage has ever been changed, and due to a past change in open-circuit voltage, the process proceeds to step 1113. Step 1113 determines whether the absolute value of the difference (theoretical internal resistance value–rear internal resistance value) is less than a second resistance value R2 which is a small value. In the case where the capacitance remains unchanged by battery change, the determination in step 1113 is positive, and the process proceeds to step 1114. Step 1114 determines the battery change (capacitance remains the same). In this case, the vehicle occupants are informed of the battery change to by the announcing means 3 shown in FIG. 1 in the next step 1115 thereby ending the routine. In the case where the determination in any of steps 1111, 1112 and 1113 is negative, battery change is not determined, and the process proceeds to step 1122 to execute the process of determining battery degeneration.

(3) Process Executed in the Case Where the Capacitance is Decreased by Battery Change In the case where the capacitance is decreased by battery change, the difference, though large between the detected battery capacitance and normal battery capacitance, is opposite in polarity to the case where the capacitance is increased by battery change. This is determined as a case in which the difference between the detected battery capacitance and the normal battery capacitance is not smaller than the first capacitance criterion value C0 nor the absolute value of the difference between the detected battery capacitance, and the normal battery capacitance is less than the second capacitance criterion value C1. In this case, the determination in both steps 1103 and 1110 are negative and the process proceeds to step 1116.

Step 1116 determines whether the battery change has ever been recognized or not, and if the battery changed has been recognized, the process proceeds to step 1117. Step 1117 determines whether the open-circuit voltage has ever been changed or not, and due to the actual open-circuit voltage change, the process proceeds to step 1118. Step 1118 determines whether the absolute value of the theoretical internal resistance value minus the actual internal resistance value (theoretical internal resistance value–actual internal resistance value) is not smaller than a third resistance value R3 or not. In the case where the capacitance is decreased by battery change, the determination in step 1118 is positive and the process proceeds to step 1119 to determine battery change (capacitance decreased). In the next step 1120, the battery change is notified to the vehicle occupants by the announcing means 3 shown in FIG. 1, followed by proceeding to step 1121. In step 1121, the process of switching the control operation described later is executed thereby to end the routine. In the case where the determination is negative in any of steps 1116, 1117 and 1118, the battery change is not determined, and the process proceeds to step 1122 thereby to execute the process of determining battery degeneration.

Figure 12:
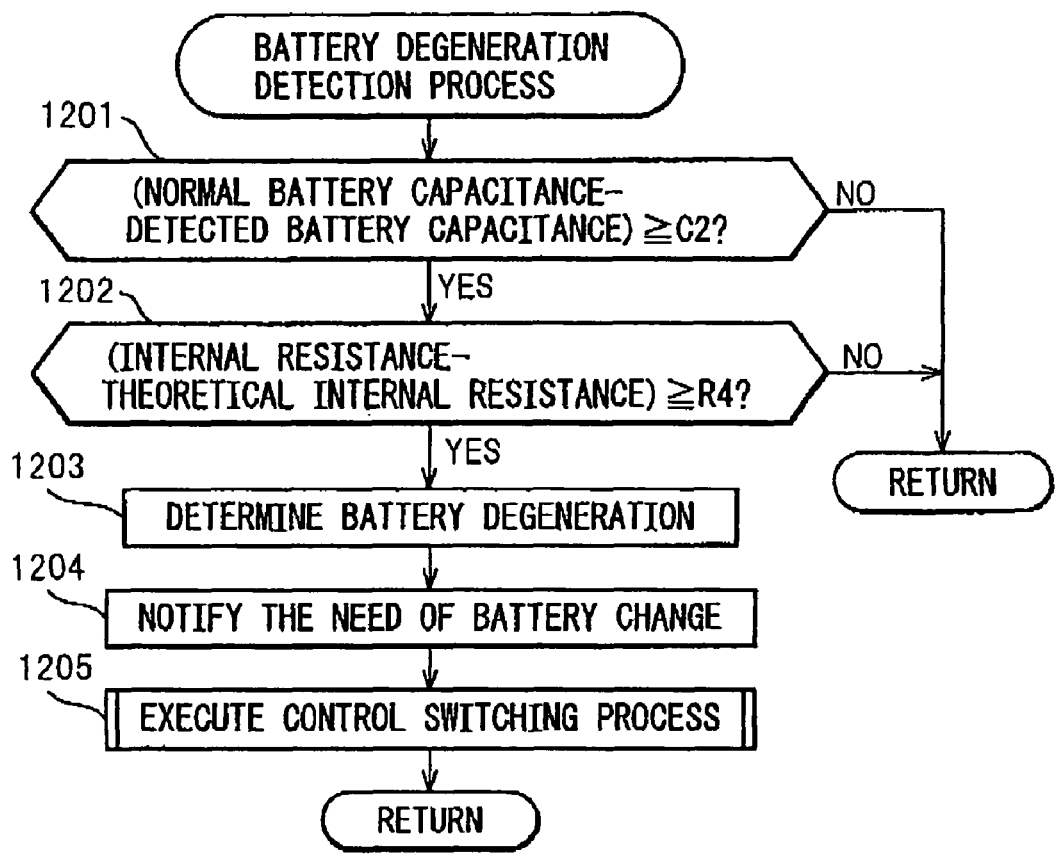
FIG. 12 is a flowchart showing the steps of the process for detecting battery degeneration in the battery monitor apparatus according to this invention.

FIG. 12 shows the steps of the process for detecting the battery degeneration executed by the battery monitor apparatus 1 according to this invention. Step 1201 determines whether the value of the normal battery capacitance minus the detected battery capacitance (normal battery capacitance–detected battery capacitance) is not smaller than a third capacitance criterion value C2 or not, and in the case where the value of the normal battery capacitance minus the detected battery capacitance is not smaller than the third capacitance criterion value C2, the process proceeds to step 1202 to determine whether the value of the internal resistance value less the theoretical resistance value is not smaller than a fourth resistance value R4 or not. Upon determination that the internal resistance value minus the theoretical resistance value is not smaller than the fourth resistance value R4, the process proceeds to step 1203 to determine that the battery is degenerated. In this case, the vehicle occupants are notified of the need to change the battery in step 1204, and the process of switching the control operation is executed thereby to end the routine.

In the case where step 1201 determines that the value of the normal battery capacitance minus the detected battery capacitance is smaller than C2 or in the case where step 1202 determines that the value of the internal resistance minus the theoretical resistance is smaller than R4, then the battery is not degenerated and therefore the routine is ended.

Figure 13:
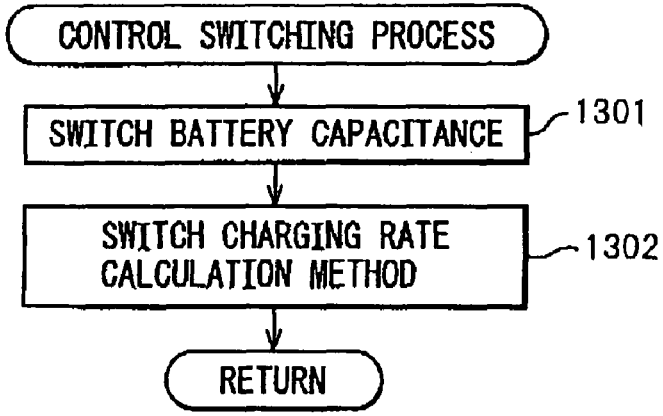
FIG. 13 is a flowchart showing the steps of the process for switching control operation in the battery monitor apparatus according to this invention.

FIG. 13 shows the steps of the control switching process executed by the battery monitor apparatus 1 according to the invention. In the case where the battery is changed in capacitance or degenerated, the battery charge characteristic becomes different from the past one. Control switching process, therefore, is executed to prevent the battery from running short of power or from being overcharged while the vehicle is running. Based on the data detected in step 1301, the battery capacitance is switched, and the battery charging rate calculation method is changed in step 1302 thereby to end-the routine.

Assuming that the preceding battery capacitance is 50 AH and the present detected battery capacitance is 60 AH, for example, the charging rate is increased by 1.2 times in spite of the same voltage.

Figure 14A:
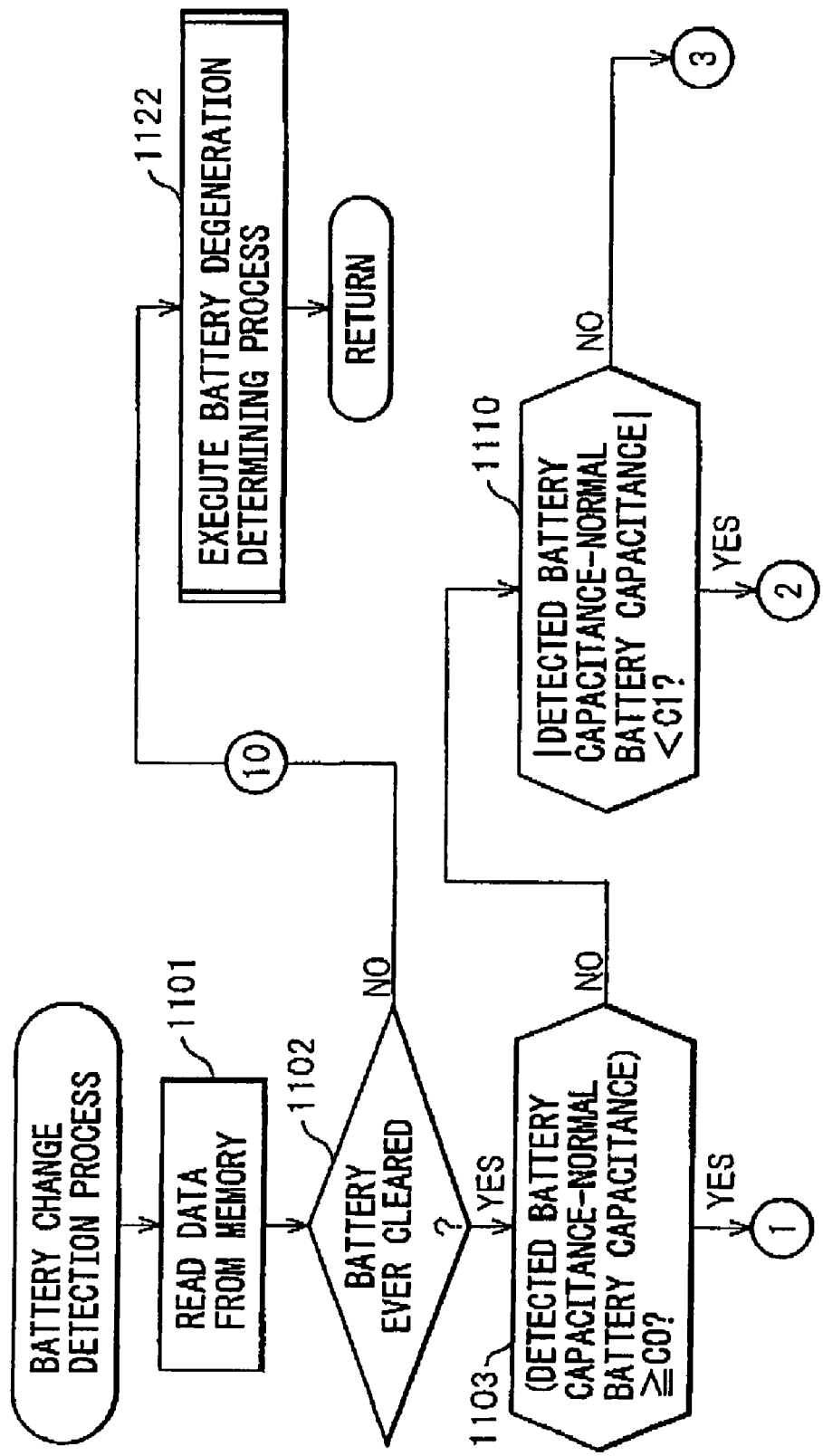
FIGS. 14A to 14C are flowcharts showing the steps of a modification of the process for detecting battery change in the battery monitor apparatus according to this invention explained with reference to FIGS. 11A to 11C.
Figure 14B:
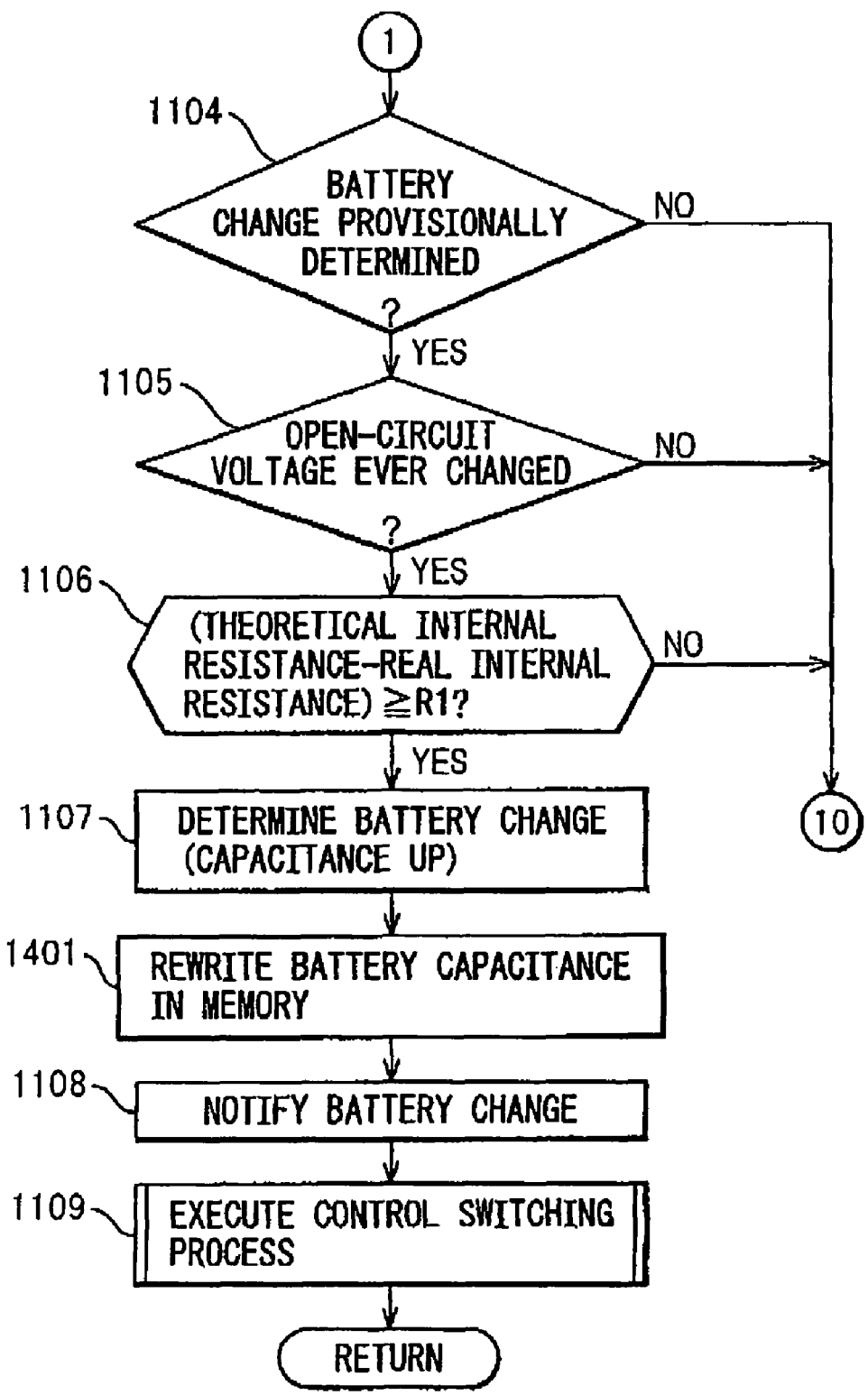
Figure 14C:
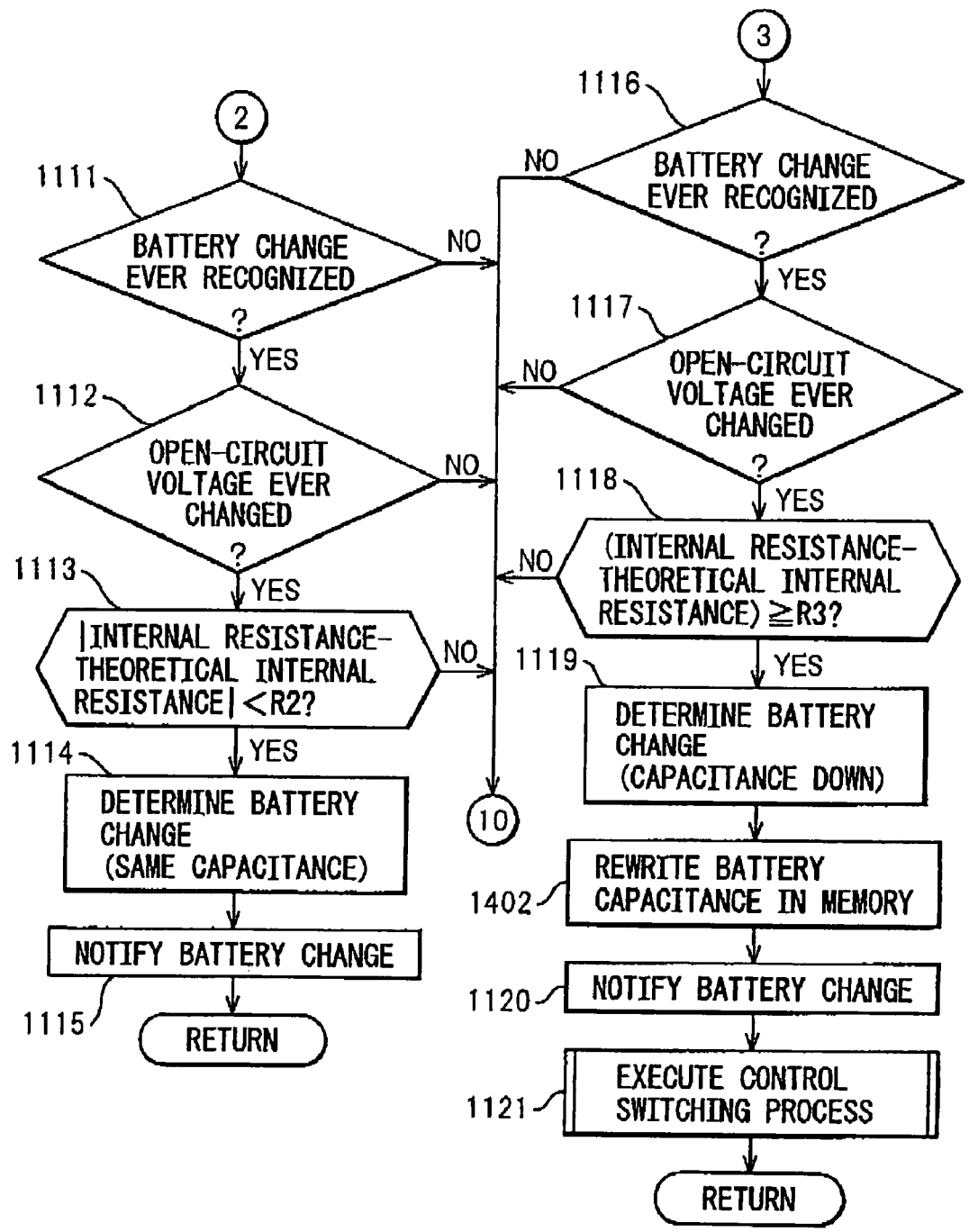

FIGS. 14A to 14C show the steps of a modification of the battery change detecting process executed by the battery monitor apparatus 1 according to the invention explained with reference to FIGS. 11A to 11C. The process in this embodiment is different from the process explained with reference to FIGS. 11A to 11C only in that the process of rewriting the battery capacitance in the memory is added between steps 1107 and 1108 and between steps 1119 and 1120. Specifically, in the case where steps 1107 and 1119 determine that the battery is changed to another battery of a different capacitance, the new battery capacitance is stored in memory. The steps representing the same process, therefore, are designated by the same step numbers, respectively, and will not be explained hereafter.

Figure 15A:
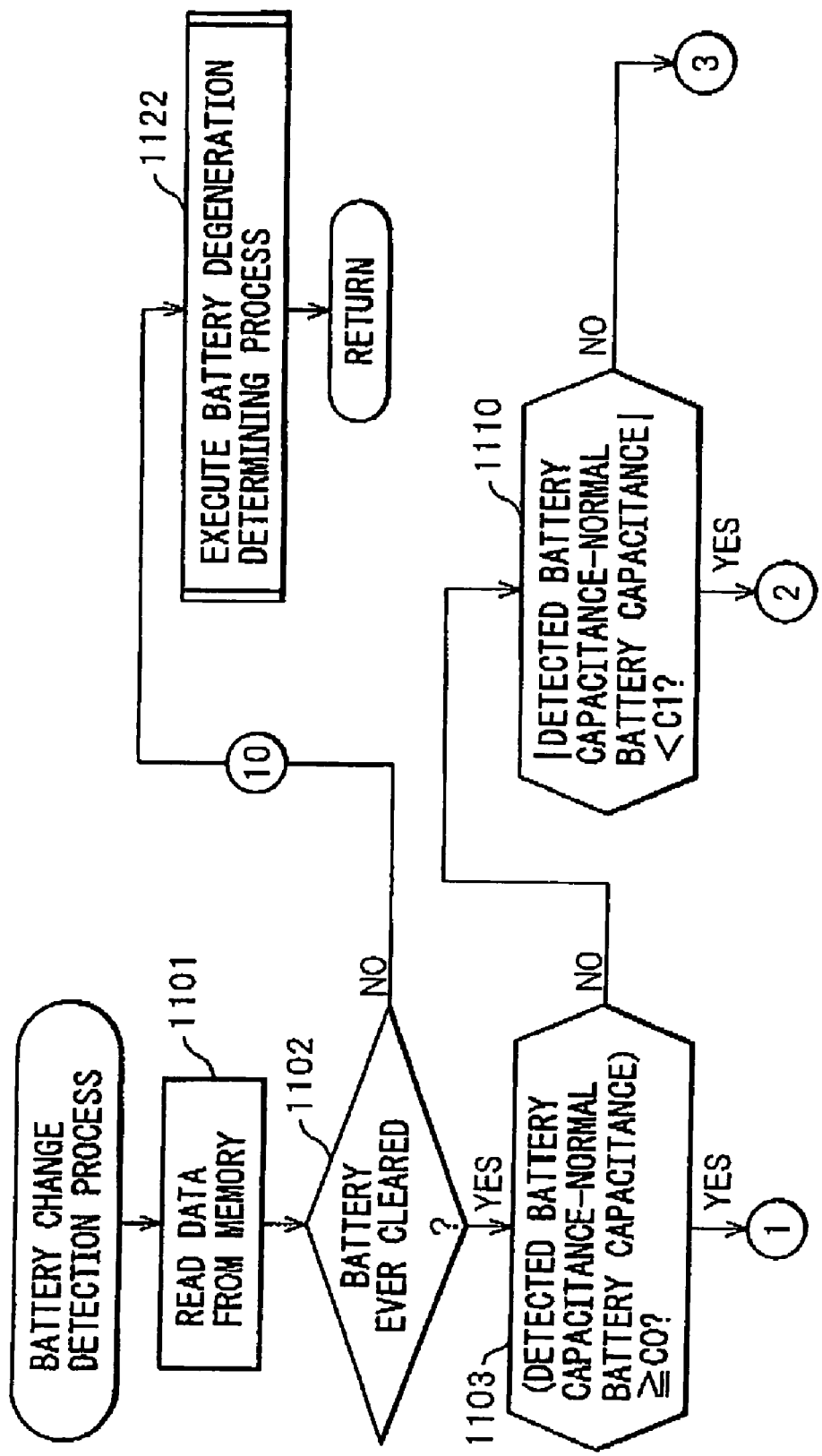
Figure 15B:
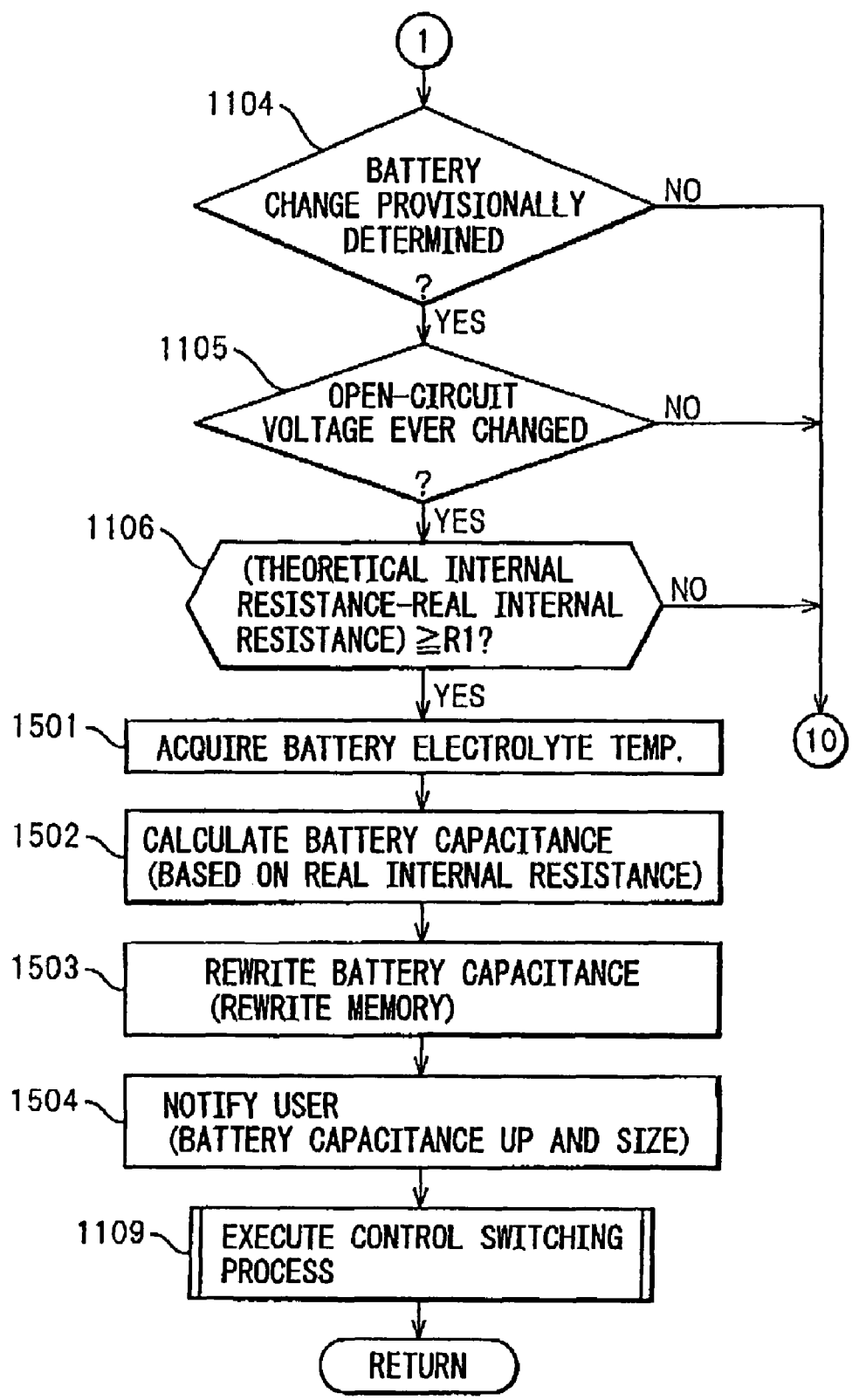

FIGS. 15A to 15C show the steps of a modification of the battery change detecting process executed by the battery monitor apparatus 1 according to the invention explained with reference to FIGS. 11A to 11C. The process in this embodiment is different from the process explained with reference to FIGS. 11A to 11C only in that steps 1107 to 1108 are replaced with steps 1501 to 1504 and steps 1119, 1120 with steps 1505 to 1508. Therefore, the steps indicating the same processes are designated by the same step numbers, respectively, and will not be explained hereafter.

According to this modification, upon determination that the theoretical internal resistance minus the real internal resistance is not less than the first resistance value R1 in step 1106, i.e. in the case where the battery is required to be changed for capacitance increase, the answer is positive and the process proceeds to step 1501, in which the battery liquid temperature is acquired, followed by step 1502 in which the battery capacitance is calculated based on the actual internal resistance value. For this calculation, the map of FIG. 16 showing the relation between the internal resistance and the capacitance of the battery is prepared for each area of, for example, 5° C. of the battery liquid temperature.

Figure 3B:
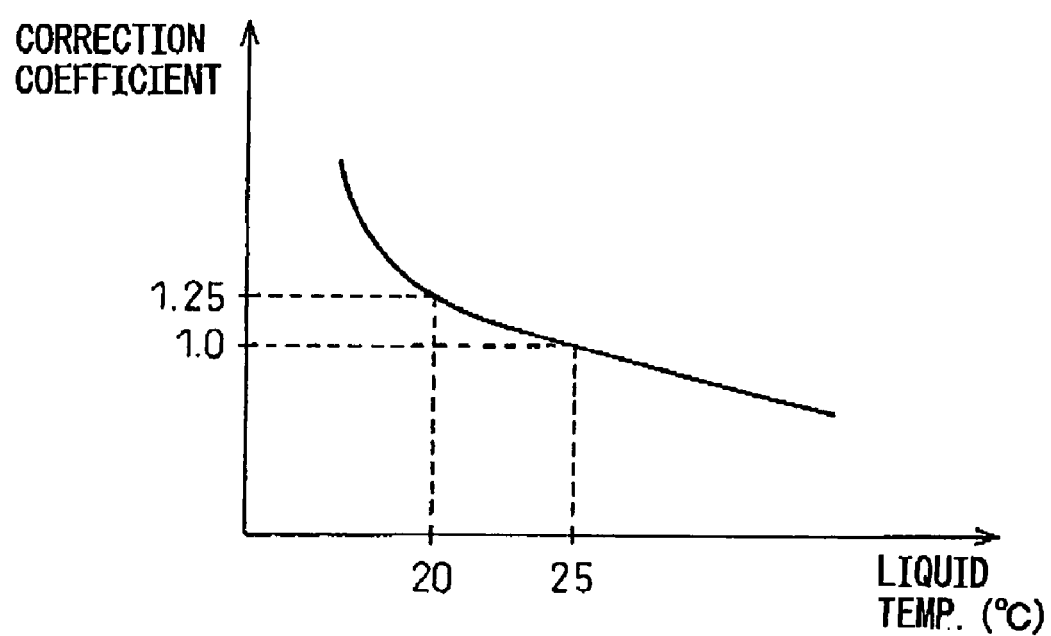
FIG. 3B is a liquid temperature vs. correction coefficient map for correcting the value of the discharge electricity amount of the battery based on the battery liquid temperature.

In calculating the battery capacitance in step 1502, the battery liquid temperature acquired in step 1501 is used and actual internal resistance is corrected to the value for the battery liquid temperature of 25° C. according to the map of FIG. 3B showing the relationship between the liquid temperature and the correction coefficient. After that, battery capacitance is calculated from the map of FIG. 16 showing the relationship between the internal resistance and the capacitance of the battery. In step 1503, the calculated battery capacitance is stored in memory. In step 1504, an increase in battery size and battery capacitance stored in the memory are notified to the user, after which the control switching process of step 1109 is executed thereby to end the routine.

Also, according to this modification, upon determination in step 1118 that the theoretical internal resistance minus the real internal resistance is not less than the third resistance value R3, i.e. in the case of battery change for capacitance decrease, the answer is positive and the process proceeds to step 1505, in which battery liquid temperature is acquired, and the actual internal resistance is corrected to the value for the liquid temperature of 25° C. by the map of FIG. 3B showing the relationship between the liquid temperature and the correction coefficient. After that, in step 1506, the battery capacitance is calculated from the map of FIG. 16 showing the relationship between the internal resistance and the capacitance of the battery. The battery capacitance thus calculated is stored in memory in step 1507. In step 1508, the user is notified of a decrease in the battery capacitance stored in the memory, along with battery size, after which the control switching process is executed in step 1121 to end the routine.

Figure 17:
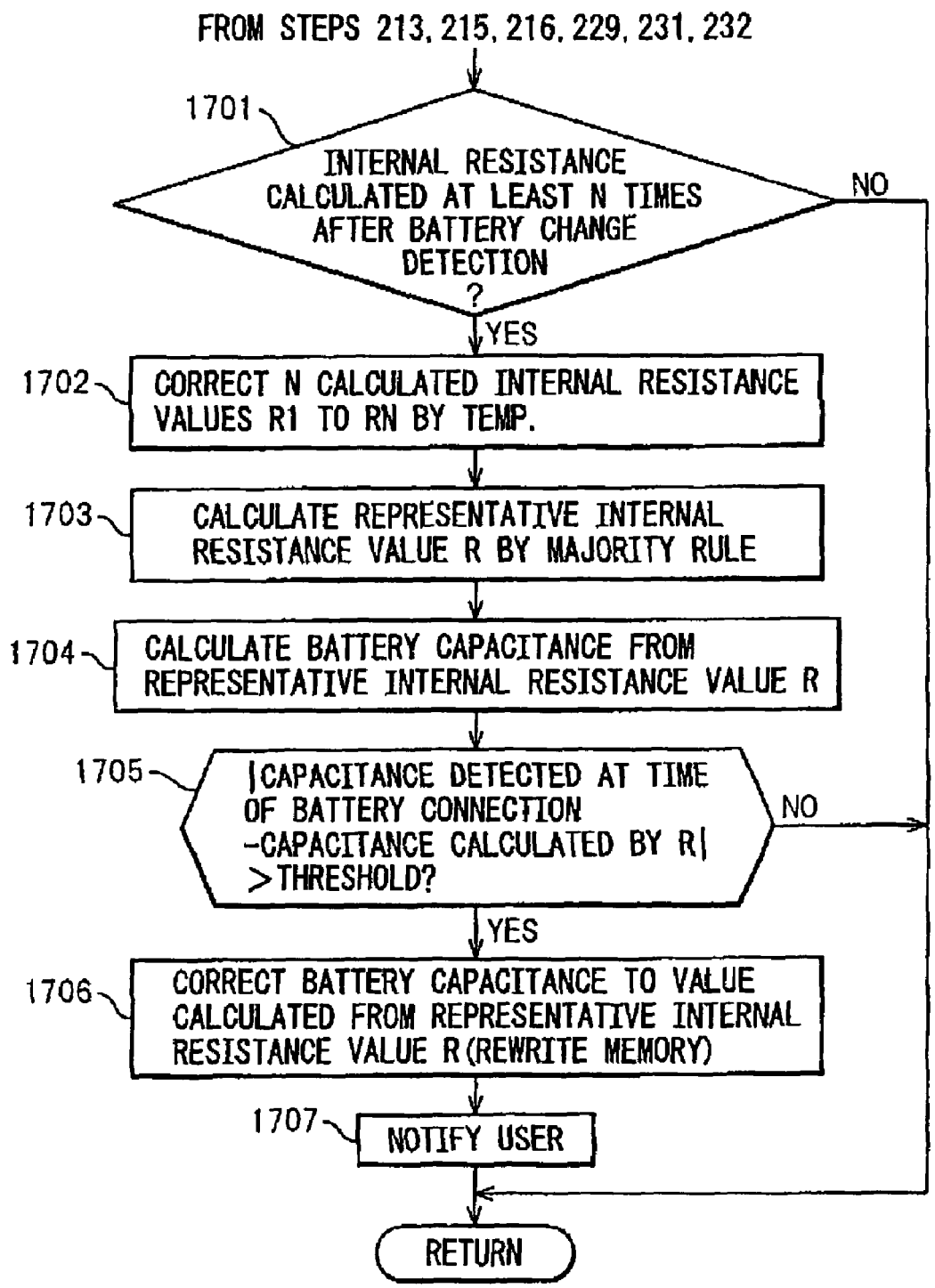
FIG. 17 is a flowchart showing the steps of the process executed after the battery capacitance detecting process described with reference to FIGS. 2A to 2C.

FIG. 17 is a flowchart showing the steps of the process for detecting the battery capacitance explained with reference to FIGS. 2A to 2C, which process is executed after steps 213, 215, 216, 229, 231, 232 shown in FIGS. 2A to 2C. In step 1701, the battery change is detected, followed by determination whether the internal resistance value (real internal resistance value) of the battery has been calculated at least N times. In the case where the number of times the internal resistance value of the battery is calculated is less than N, the process is ended as it is, while in the case where the number of times is N or more, the process proceeds to step 1702.

In step 1702, the N internal resistance values R1 to RN calculated after detection of the battery change are corrected by temperature. In this correction by temperature, as explained above, the actual internal resistance is corrected to the value for the liquid temperature of 25° C. according to the map of FIG. 3B showing the relationship between the liquid temperature and the correction coefficient. After complete correction by temperature, the representative internal resistance value R after battery change detection is calculated using the well-known averaging process or the majority rule for the N internal resistance values R1 to RN.

After that, in step 1704, the battery capacitance is calculated from the map of FIG. 16 showing the relationship between the internal resistance and the capacitance of the battery using the representative internal resistance value R calculated in step 1703. The battery capacitance may be calculated by a method other than the aforementioned method, and the detection method is not specifically limited. Once the battery capacitance is calculated upon lapse of a predetermined time after battery change detection, step 1705 determines whether the absolute value of the difference between the battery capacitance detected at the time of battery connection (when the old battery is removed and a new battery is connected) and the battery capacitance calculated in step 1704 is larger than a predetermined threshold value or not.

Upon determination in step 1705 that the absolute value of the difference between the battery capacitance detected at the time of battery connection and the battery capacitance calculated in step 1704 is smaller than the predetermined threshold value, the process is ended as it is. In the case where the difference is larger than the predetermined threshold value, the process proceeds to step 1706, in which the battery capacitance is corrected to the value calculated from the representative internal resistance value R and the memory contents are rewritten. In step 1707, the user is notified that the battery has been changed and whether the capacitance of the new battery is the same, larger or smaller than that of the old battery, after which the routine is ended.

The control operation according to the embodiment described above assumes that the discharge of a large current after battery change at the time of engine starting (turning of the starter), and engine starting is performed first before starting to drive the vehicle after a battery change. By performing this control operation while calculating the internal resistance of the battery based on the discharged state of the large current from the battery after detecting the battery change and then calculating the battery capacitance (capacitance of the full charged battery) based on this internal resistance, i.e. by calculating the battery capacitance according to the discharge state at the time of engine starting, time can be shortened before calculation of the battery capacitance after battery change.

The aforementioned embodiment represents a case in which a lead battery is used as the in-vehicle battery of which the degeneration or change is to be determined. The determination of battery degeneration and battery change according to the invention is also applicable, to a lithium ion battery or nickel hydrogen battery with equal effect.

Although only some exemplary embodiments of this invention have been described in detail above, those skilled in the art will appreciate that many modifications are possible in the exemplary embodiments without materially departing from the novel teachings and advantages of this invention. Accordingly, all such modifications are intended to be included within the scope of this invention.

What is claimed is:

1. An automotive battery monitor apparatus comprising:
   a battery change detector for detecting that the battery mounted on a vehicle has been changed;
   a battery real internal resistance calculation unit for detecting, upon receipt of an engine start request and upon detection by the battery change detector that the battery has been changed, the internal resistance of the battery based on the battery discharge state at the time of starting the engine;
   a battery capacitance calculation unit for calculating the battery capacitance after the battery change based on the internal resistance calculated by the battery real internal resistance calculation unit;
   a battery charge rate calculation method changing unit for changing the method of calculating the battery charge rate based on the battery capacitance calculated by the battery capacitance calculation unit; and
   a battery degeneration detector for detecting the degeneration of the battery based on the calculated battery capacitance when the battery change detector determines that the battery has not been changed;
   wherein the battery real internal resistance calculation unit detects the real internal resistance of the battery by dividing a change of the battery voltage at predetermined time intervals by a change of the battery current at the same predetermined time intervals, the detection occurring after a battery change at the time the engine is started but before the vehicle is driven.

* * * * *